US008084799B2

(12) United States Patent
Happ et al.

(10) Patent No.: US 8,084,799 B2
(45) Date of Patent: *Dec. 27, 2011

(54) INTEGRATED CIRCUIT WITH MEMORY HAVING A STEP-LIKE PROGRAMMING CHARACTERISTIC

(75) Inventors: Thomas Happ, Tarrytown, NY (US); Jan Boris Philipp, Peekskill, NY (US)

(73) Assignee: Qimonda AG, Munich (DE)

( * ) Notice: Subject to any disclaimer, the term of this patent is extended or adjusted under 35 U.S.C. 154(b) by 452 days.

This patent is subject to a terminal disclaimer.

(21) Appl. No.: 11/488,422

(22) Filed: Jul. 18, 2006

(65) Prior Publication Data

US 2008/0017894 A1   Jan. 24, 2008

(51) Int. Cl.
*H01L 27/108* (2006.01)
(52) U.S. Cl. ....................................................... 257/296
(58) Field of Classification Search .................... 257/296
See application file for complete search history.

(56) References Cited

U.S. PATENT DOCUMENTS

| | | | |
|---|---|---|---|
| 5,796,133 A * | 8/1998 | Kwon et al. ................... | 257/295 |
| 6,507,061 B1 | 1/2003 | Hudgens et al. | |
| 6,674,115 B2 | 1/2004 | Hudgens et al. | |
| 6,838,692 B1 | 1/2005 | Lung | |
| 6,927,410 B2 | 8/2005 | Chen | |
| 6,998,289 B2 | 2/2006 | Hudgens et al. | |
| 7,688,618 B2 * | 3/2010 | Happ et al. ................... | 365/163 |
| 2003/0080427 A1 | 5/2003 | Hudgens et al. | |
| 2005/0112896 A1 | 5/2005 | Hamann et al. | |
| 2005/0127349 A1 | 6/2005 | Horak et al. | |
| 2007/0227710 A1 * | 10/2007 | Belady et al. .................. | 165/122 |
| 2007/0295948 A1 * | 12/2007 | Lam et al. .......................... | 257/4 |

OTHER PUBLICATIONS

S. Lai, "Current Status of the Phase Change Memory and its Future" IEDM 2003.
S. Lai, T. Lowrey, "OUM—a 180 nm Nonvolatile Memory Cell Element Technology for Stand Alone and Embedded Applications", IEDM 2001.
S. Ahn, "Highly reliable 50 nm contact cell technology for 256Mb PRAM", VLSI 2005.
Pirvano, submission to NVSMW, 2006. "Scaling Analysis of Phase-Change Memory Technology".
F. Pellizer, et al, "Novel Utrench Phase Change Memory Cell for Embedded and Standalone Non-Volatile Memory Applications", VLSI 2004.
S.L. Cho, "Highly Scalable On-Axis Confined Cell Structure for High Density PRAM Beyond 256Mb", VLSI 2005.
Jeong, et al. "Switching Current Scaling and Reliability Evaluation in Pram", NVSMW 2004.
Y.N. Hwang, et al. "Full Integration and Reliability Evaluation of Phase-Change RAM Based on 0.24um-CMOS Technologies".
H. Horii, et al. "A Novel Cell Technology using N-doped GeSbTe films for phase change RAM", VLSI, 2003.
Y.H Ha, et al, "An Edge Contact Type Cell for Phase Change RAM Featuring Very Low Power Consumption", VLSI, 2003.
ECD Ovonics, Research Report, Ovonic Unified Memory. http://www.ovonics.com/PDFs/ELEC_Memory_Research_Report/OUM.pdf, 1999.

* cited by examiner

*Primary Examiner* — Thao Le
*Assistant Examiner* — Tanika Warrior
(74) *Attorney, Agent, or Firm* — Dicke, Billig & Czaja, PLLC

(57) ABSTRACT

A memory cell includes a first electrode, a second electrode, and phase change material between the first electrode and the second electrode. The phase change material has a step-like programming characteristic. The first electrode, the second electrode, and the phase change material form a via or trench memory cell.

40 Claims, 27 Drawing Sheets

INTEGRATED CIRCUIT WITH MEMORY HAVING A STEP-LIKE PROGRAMMING CHARACTERISTIC

CROSS-REFERENCE TO RELATED APPLICATIONS

This Utility Patent Application is related to U.S. patent application Ser. No. 11/488,313, entitled "PHASE CHANGE MEMORY CELL HAVING A STEP-LIKE PROGRAMMING CHARACTERISTIC," and U.S. patent application Ser. No. 11/488,869, entitled "PHASE CHANGE MEMORY CELL HAVING A STEP-LIKE PROGRAMMING CHARACTERISTIC," both filed on the same day as the present application, and both of which are incorporated herein by reference.

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself, or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states. If the phase change memory cell is programmed to one of three different resistance levels, 1.5 bits of data per cell can be stored. If the phase change memory cell is programmed to one of four different resistance levels, two bits of data per cell can be stored, and so on. For simplicity, the description in this disclosure is substantially focused on four different resistance levels or states and two bits of data per cell. This is for illustrative purposes only, however, and not intended to limit the scope of the invention. In principle it is possible to store three or more states.

To program a phase change memory cell to an intermediate resistance value, the amount of crystalline material coexisting with amorphous material and hence the cell resistance is controlled via a suitable write strategy. Reliable and repeatable programming of a phase change memory cell requires that substantially similar programming conditions result in substantially similar resistance values. Substantially similar programming conditions including substantially identical current and/or voltage pulses applied to typical phase change memory cells, however, may result in different resistance values due to fabrication fluctuations, electrical noise, temperature variations, or other temporal fluctuations.

For these and other reasons, there is a need for the present invention.

SUMMARY

One embodiment of the present invention provides a memory cell. The memory cell includes a first electrode, a second electrode, and phase change material between the first electrode and the second electrode. The phase change material has a step-like programming characteristic. The first electrode, the second electrode, and the phase change material form a via or trench memory cell.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
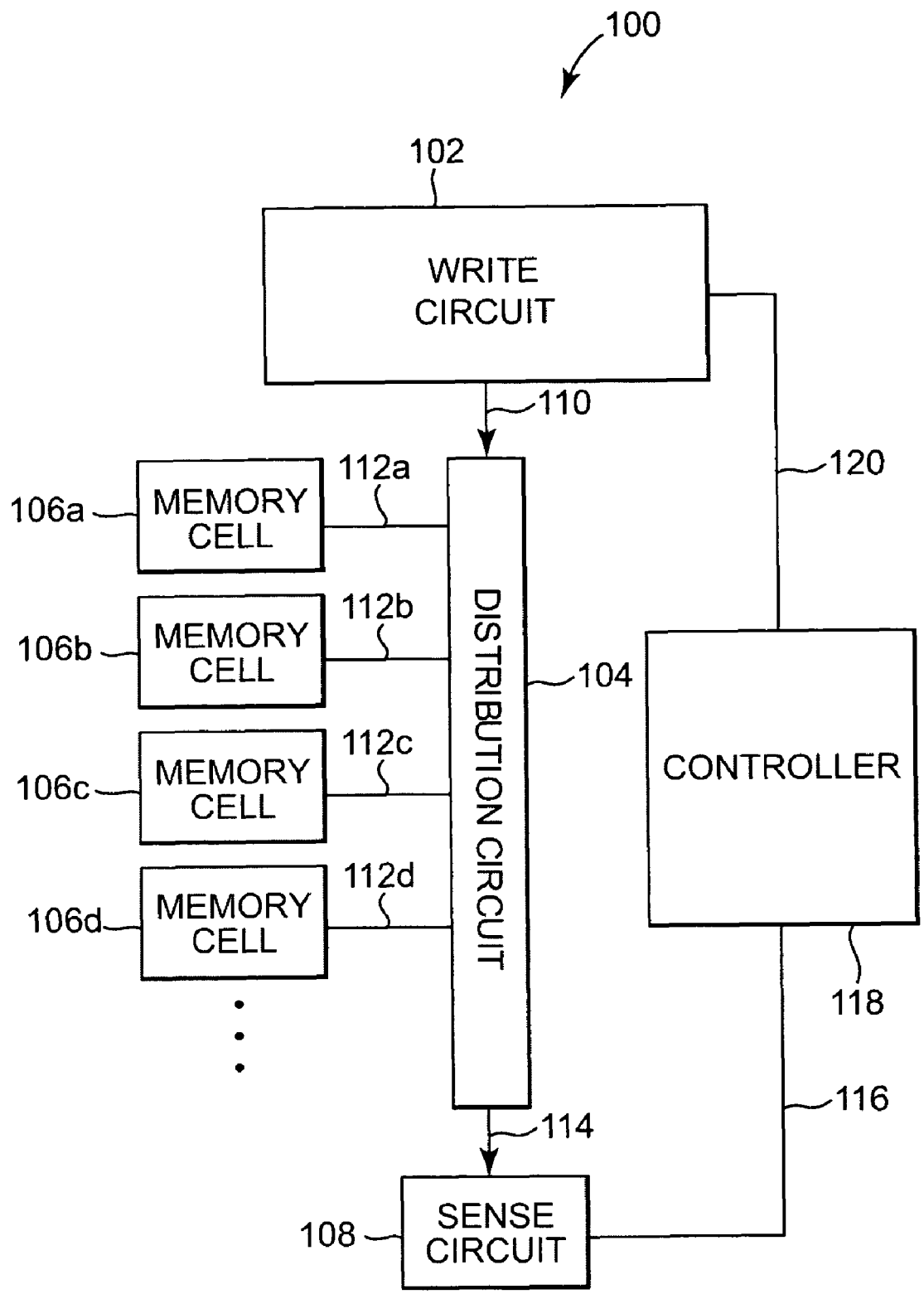
FIG. 1A is a block diagram illustrating one embodiment of a memory device.

FIG. 1A is a block diagram illustrating one embodiment of a memory device 100. Memory device 100 includes a write circuit 102, a distribution circuit 104, memory cells 106a, 106b, 106c, and 106d, a sense circuit 108, and a controller 118. Each of the memory cells 106a-106d is a phase change memory cell that stores data based on the amorphous and crystalline states of phase change material in the memory cell. Also, each of the memory cells 106a-106d can be programmed into one of more than two states by programming the phase change material to have intermediate resistance values. To program one of the memory cells 106a-106d to an intermediate resistance value, the amount of crystalline material coexisting with amorphous material—and hence the cell resistance—is controlled by controller 118 following a suitable write strategy.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. In addition, distribution circuit 104 is electrically coupled to sense circuit 108 through signal path 114, and sense circuit 108 is electrically coupled to controller 118 through signal path 116. Controller 118 is also electrically coupled to write circuit 102 through signal path 120.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines more than two states for storing data within memory device 100. Memory cells 106a-106d have a step-like programming characteristic to facilitate multi-bit data storage.

In one embodiment, the phase change material of each memory cell 106a-106d forms a step-like pattern to achieve a step-like programming characteristic. The step-like pattern includes a plurality of phase change material portions having different cross-sectional widths. Each contiguous step in the pattern is surrounded by an increasing or a decreasing number of spacers or spacer pairs of varying heights, such that the spacers or spacer pairs form a step-like pattern contacting and defining the step-like pattern of the phase change material. In one embodiment, the spacers or spacer pairs include a spacer material of the same thermal conductivity as surrounding insulation material.

When current is applied to the step-like pattern of phase change material, the current density through each step varies. The step having the narrowest cross-section provides the highest current density and the step having the widest cross-section provide the lowest current density. The step having the highest current density transitions from an amorphous state to a crystalline or from a crystalline state to an amorphous state before the step or steps providing lower current densities. The step having the highest current density transitions first since the temperature induced within the phase change material is greater within the step providing the highest current density. If a higher current is passed through the cell, the next narrowest step transition states. In this way, a selected number of steps of phase change material in the step-like pattern are programmed to reliably and repeatably provide a specific resistance value.

In another embodiment, the spacers or spacer pairs include a spacer material, such as a low-k material, of a different thermal conductivity than the surrounding insulation material, thereby varying the thermal environment between steps having different cross-sections. By varying the thermal environment between the steps in the step-like pattern, the temperature induced within each step is further controlled, such that a selected number of steps of phase change material in the step-like pattern are programmed to reliably and repeatably provide a specific resistance value.

In another embodiment, at least two of the spacers or spacer pairs include different spacer materials. The at least two spacer pairs have different thermal conductivities. By varying the thermal environment between the steps in the step-like pattern, the temperature induced within each step is further controlled, such that a selected number of steps of phase change material in the step-like pattern are programmed to reliably and repeatably provide a specific resistance value.

In another embodiment, at least two of the phase change material steps of the step-like pattern include different phase change materials. The at least two phase change materials have different crystallization temperatures. By varying the crystallization temperature between the steps in the step-like pattern, the transition of each step is further controlled, such that a selected number of steps of phase change material in the step-like pattern are programmed to reliably and repeatably provide a specific resistance value. In other embodiments, the step-like pattern, the varying of spacer materials, and the varying of phase change materials can be combined in any suitable combination to achieve a step-like programming characteristic and to facilitate the reliable programming of multiple states.

In the amorphous state, a phase change material exhibits significantly higher resistivity than in the crystalline state.

Therefore, by controlling the amorphous and crystalline fractions of the phase change material, the more than two states of memory cells 106a-106d differ in their electrical resistivity. In one embodiment, the more than two states include three states and a trinary system is used, wherein the three states are assigned bit values of "0", "1", and "2". In another embodiment, the more than two states are four states that are assigned multi-bit values, such as "00", "01", "10", and "11". In other embodiments, the more than two states can be any suitable number of states in the phase change material of a memory cell.

Controller 118 controls the operation of write circuit 102 and sense circuit 108. Controller 118 includes a microprocessor, microcontroller, or other suitable logic circuitry for controlling the operation of write circuit 102 and sense circuit 108. Controller 118 controls write circuit 102 for setting the resistance states of memory cells 106a-106d. Controller 118 controls sense circuit 108 for reading the resistance states of memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d. In one embodiment, distribution circuit 104 includes a plurality of transistors that controllably direct voltage pulses to each of the memory cells 106a-106d. In other embodiments, write circuit 102 provides current pulses to distribution circuit 104 through signal path 110, and distribution circuit 104 controllably directs the current pulses to memory cells 106a-106d through signal paths 112a-112d.

Sense circuit 108 reads each of the more than two states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d. In one embodiment, to read the resistance of one of the memory cells 106a-106d, sense circuit 108 provides current that flows through one of the memory cells 106a-106d and sense circuit 108 reads the voltage across that one of the memory cells 106a-106d. In one embodiment, sense circuit 108 provides voltage across one of the memory cells 106a-106d and reads the current that flows through that one of the memory cells 106a-106d. In one embodiment, write circuit 102 provides voltage across one of the memory cells 106a-106d and sense circuit 108 reads the current that flows through that one of the memory cells 106a-106d. In one embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates a current or voltage pulse for heating the phase-change material in the target memory cell. In one embodiment, write circuit 102 generates an appropriate current or voltage pulse, which is fed into distribution circuit 104 and distributed to the appropriate target memory cell 106a-106d. The current or voltage pulse amplitude and duration are controlled by controller 118 depending on the specific state to which the target memory cell 106a-106d is being programmed. Generally, a "set" operation of a memory cell is heating the phase-change material of the target memory cell above its crystallization temperature (but below its melting temperature) long enough to achieve the crystalline state or a partially crystalline and partially amorphous state. Generally, a "reset" operation of a memory cell is heating the phase-change material of the target memory cell above its melting temperature, and then quickly quench cooling the material, thereby achieving the amorphous state or a partially amorphous and partially crystalline state. A memory cell can be programmed to a resistance state between an amorphous state and a crystalline state by applying a partial "set" or a partial "reset" pulse to the memory cell to provide amorphous and crystalline fractions of the phase change material.

Figure 1B:
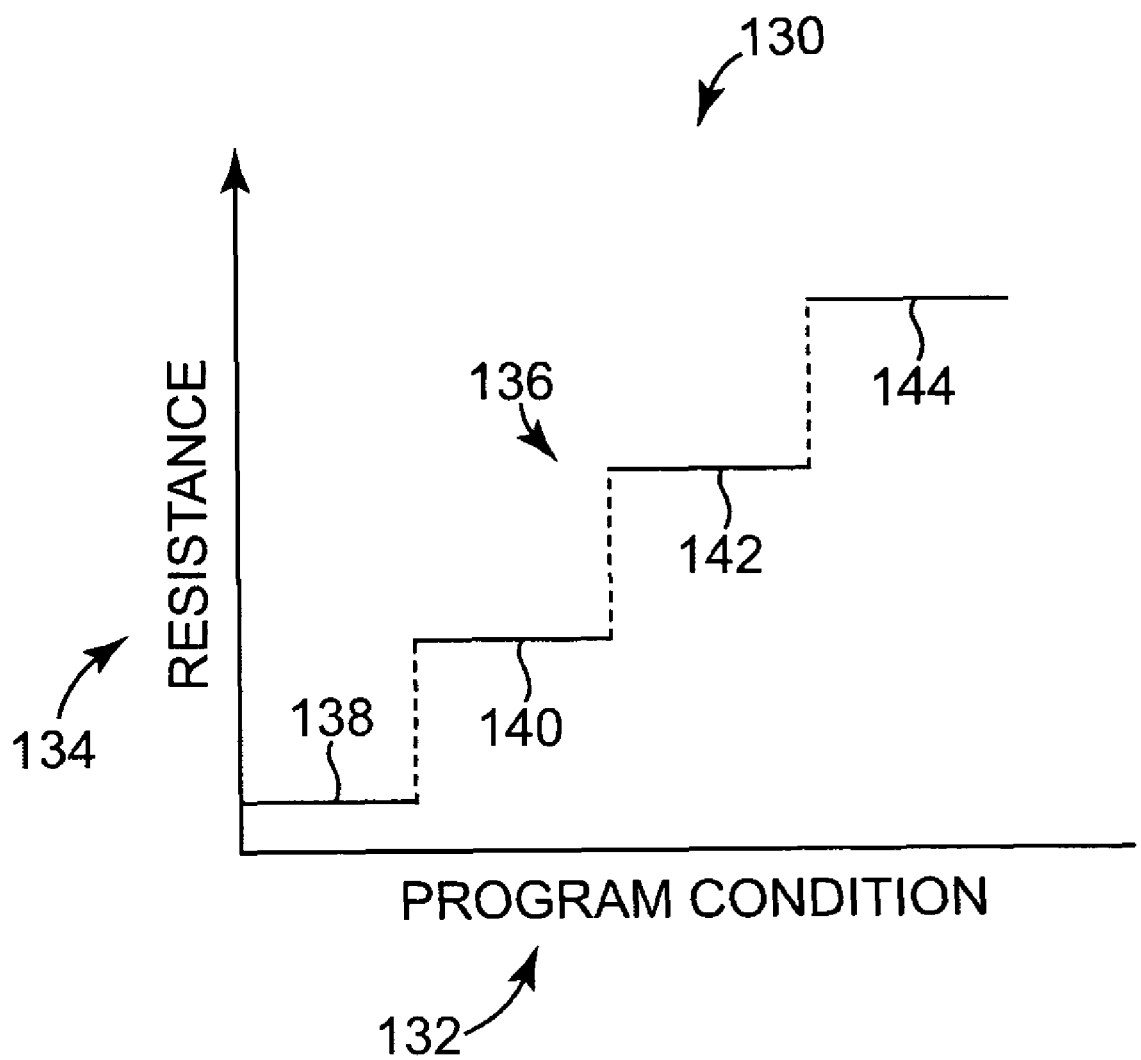
FIG. 1B is a graph illustrating one embodiment of a step-like programming characteristic for phase change memory cells.

FIG. 1B is a graph 130 illustrating one embodiment of a step-like programming characteristic 136 for phase change memory cells 106a-106d. Graph 130 includes program condition on x-axis 132 and resistance on y-axis 134. Suitable program parameters can include for example write time or pulse amplitude. Step-like programming characteristic 136 provides reduced variation of programmed resistance around a selected program condition. In one embodiment, a substantially constant resistance level or step is present at a selected program condition.

At a first program condition, a memory cell is programmed to a first resistance step or state as indicated at 138. In one embodiment, the step indicated at 138 is a "00" state. At a second program condition, a memory cell is programmed to a second resistance step or state as indicated at 140. The second resistance state is greater than the first resistance state. In one embodiment, the step indicated at 140 is a "01" state. At a third program condition, a memory cell is programmed to a third resistance step or state as indicated at 142. The third resistance state is greater than the second resistance state. In one embodiment, the step indicated at 142 is a "10" state. At a fourth program condition, a memory cell is programmed to a fourth resistance step or state as indicated at 144. The fourth resistance state is greater than the third resistance state. In one embodiment, the step indicated at 144 is a "11" state. In other embodiments, a memory cell can have any suitable step-like programming characteristic including any suitable number of resistance steps or states. The following embodiments of phase change memory cells provide a step-like programming characteristic.

Figure 2A:
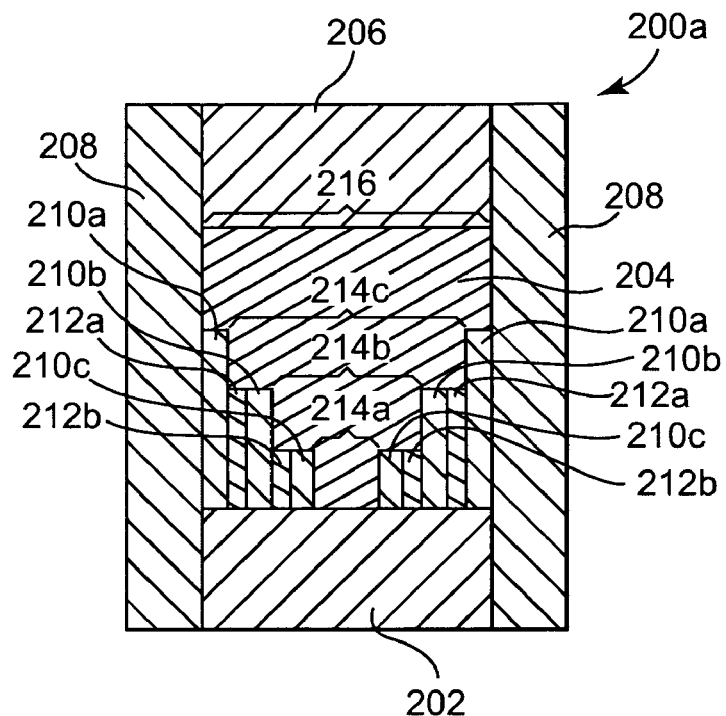
FIG. 2A illustrates a cross-sectional view of one embodiment of a phase change memory cell.

FIG. 2A illustrates a cross-sectional view of one embodiment of a phase change memory cell 200a. In one embodiment, each of the memory cells 106a-106d is similar to phase change memory cell 200a. In one embodiment, phase change memory cell 200a is a via or trench based phase change memory cell. Phase change memory cell 200a includes a first electrode 202, phase change material 204, a second electrode 206, insulation material 208, a first spacer or spacer pair 210a, a second spacer or spacer pair 210b, a third spacer or spacer pair 210c, a first etch stop layer or layer pair 212a, and a second etch stop layer or layer pair 212b. Phase change material 204 includes a first phase change portion 214a, a second phase change portion 214b, a third phase change portion 214c, and additional phase change material 216.

First electrode 202 contacts first phase change portion 214a. First phase change portion 214a contacts second phase change portion 214b. Second phase change portion 214b contacts third phase change portion 214c. Third phase change portion 214c contacts additional phase change material 216. Additional phase change material 216 contacts second electrode 206. Phase change material 204 provides a storage location for storing two bits of data.

Insulation material 208 laterally completely encloses phase change material 204, first electrode 202, second electrode 206, and spacers 210a-210c, and etch stop layers 212a and 212b. Insulation material 208 contacts the sides of additional phase change material 216 and first spacer or spacer pair 210a. First spacer or spacer pair 210a contacts and defines third phase change portion 214c. First spacer or spacer pair 210a contacts etch stop layer or layer pair 212a. Etch stop layer or layer pair 212a contacts second spacer or spacer pair 210b. Second spacer or spacer pair 210b contacts and defines second phase change portion 214b. Second spacer or spacer pair 210b contacts second etch stop layer or layer pair 212b. Second etch stop layer or layer pair 212b contacts third spacer or spacer pair 210c. Third spacer or spacer pair 210c contacts and defines first phase change portion 214a.

Second spacer or spacer pair 210b is shorter than first spacer or spacer pair 210a. First etch stop layer or layer pair 210b is substantially the same height as second spacer or spacer pair 210b. Third spacer or spacer pair 210c is shorter than second spacer or spacer pair 210b. Second etch stop layer or layer pair 212b is substantially the same height as third spacer or spacer pair 210c.

Phase change portions 214a-214c provide a step-like pattern defined by spacers 210a-210c. Phase change portions 214a-214c provide distinct transitions between one phase change portion to another. Each phase change portion 214a-214c forms a substantially rectangular or cylindrical shape. Third phase change portion 214c has a larger cross-section than second phase change portion 214b. Second phase change portion 214b has a larger cross-section than first phase change portion 214a.

Insulation material 208 and spacers 210a-210c can be any suitable insulator, such as $SiO_2$, fluorinated silica glass (FSG), boro-phosphorous silicate glass (BPSG), boro-silicate glass (BSG), or low-k material. First electrode 202 and second electrode 206 can be any suitable electrode material, such as TiN, TaN, W, TiSiN, TiAlN, or TaAlN. Etch stop layers 212a and 212b can be any suitable material with etch selectivity with respect to spacers 210a-210c. Etch stop layer or layer pair 212a prevents further etching of spacer or spacer pair 210a when etching to form spacer or spacer pair 210b. Etch stop layer or layer pair 212b prevents further etching of spacers or spacer pairs 210a and 210b when etching to form spacer or spacer pair 210c.

Phase change material 204 may be made up of a variety of materials in accordance with the present invention. Generally, chalcogenide alloys that contain one or more elements from group VI of the periodic table are useful as such materials. In one embodiment, phase change material 204 of memory cell 200a is made up of a chalcogenide compound material, such as GeSbTe, SbTe, GeTe, or AgInSbTe. In another embodiment, phase change material 204 is chalcogen free, such as GeSb, GaSb, InSb, or GeGaInSb. In other embodiments, phase change material 204 is made up of any suitable material including one or more of the elements Ge, Sb, Te, Ga, As, In, Se, and S.

A selection device such as an active device like a transistor or diode, is coupled to first electrode 202 or second electrode 206 to control the application of current or voltage pulses to the other of first electrode 202 or second electrode 206, and thus to phase change material 204, to set and reset phase change material 204. The current density through third phase change portion 214c is less than the current density through second phase change portion 214b since second phase change portion 214b has a narrower cross-section than third phase change portion 214c. The current density through second phase change portion 214b is less than the current density through first phase change portion 214a since first phase change portion 214a has a narrower cross-section than second phase change portion 214b. Thus, a current or voltage pulse having a lower amplitude and/or duration is used to program first phase change portion 214a than to program second phase change portion 214b. Further, a current or voltage pulse having a lower amplitude and/or duration is used to program second phase change portion 214b than to program third phase change portion 214c.

During operation of phase change memory cell 200a, current or voltage pulses are applied between first electrode 202 and second electrode 206 to program phase change memory cell 200a. A first current or voltage pulse having a first amplitude and/or duration programs first phase change portion 214a without significantly affecting second and third phase change portions 214b and 214c. A second current or voltage pulse having a second amplitude and/or duration programs first and second phase change portions 214a and 214b without significantly affecting third phase change portion 214c. The second amplitude and/or duration is greater than the first amplitude and/or duration. A third current or voltage pulse having a third amplitude and/or duration programs phase change portions 214a-214c. The third amplitude and/or duration is greater than the second amplitude and/or duration.

By selectively programming phase change portions 214a-214c, phase change memory cell 200a can be programmed to provide four states in phase change material 204. In one embodiment, in a first state, phase change portions 214a-214c are amorphous. In a second state, first phase change portion 214a is crystalline, and second and third phase change portions 214b and 214c are amorphous. In a third state, first and second phase change portions 214a and 214b are crystalline, and third phase change portion 214c is amorphous. In a fourth state, phase change portions 214a-214c are crystalline.

In another embodiment, in a first state, phase change portions 214a-214c are crystalline. In a second state, first phase change portion 214a is amorphous, and second and third phase change portions 214b and 214c are crystalline. In a third state, first and second phase change portions 214a and 214b are amorphous, and third phase change portion 214c is crystalline. In a fourth state, phase change portions 214a-214c are amorphous. In other embodiments, any suitable number of phase change step-like portions 214 are used for obtaining a desired number of states in phase change memory cell 200a.

Figure 2B:
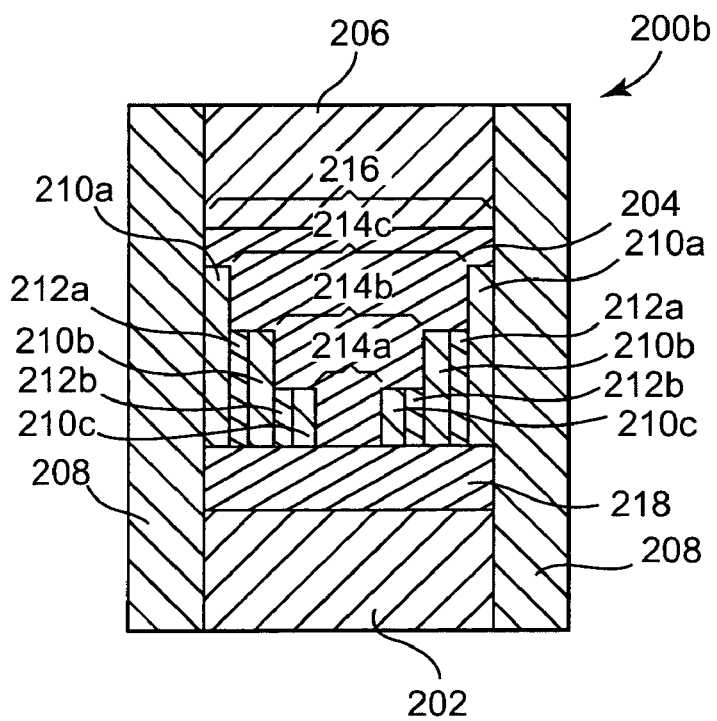
FIG. 2B illustrates a cross-sectional view of another embodiment of a phase change memory cell.

FIG. 2B illustrates a cross-sectional view of another embodiment of a phase change memory cell 200b. In one embodiment, each of the memory cells 106a-106d is similar to phase change memory cell 200b. Phase change memory cell 200b is similar to phase change memory cell 200a previously described and illustrated with reference to FIG. 2A, except that phase change memory cell 200b includes the addition of a diffusion barrier 218. Diffusion barrier 218 includes phase change material 204 and an optional electrode material layer (not shown) and prevents diffusion between phase change portions 214a-214c and first electrode 202. First electrode 202 contacts diffusion barrier 218, and diffusion barrier 218 contacts first phase change portion 214a, insulation material 208, spacers 210a-210c, and etch stop layers 212a and 212b. Phase change memory cell 200b operates similarly to phase change memory cell 200a previously described and illustrated with reference to FIG. 2A.

Figure 3A:
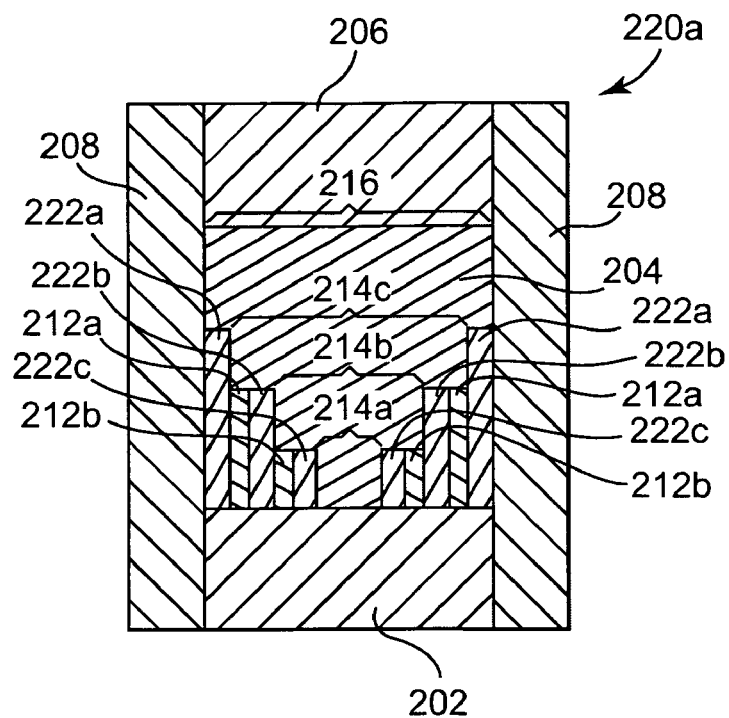
FIG. 3A illustrates a cross-sectional view of another embodiment of a phase change memory cell.

FIG. 3A illustrates a cross-sectional view of another embodiment of a phase change memory cell 220a. In one embodiment, each of the memory cells 106a-106d is similar to phase change memory cell 220a. Phase change memory cell 220a is similar to phase change memory cell 200a previously described and illustrated with reference to FIG. 2A, except that in phase change memory cell 220a spacers 210a-210c are replaced with spacers 222a-222c.

Spacers 222a-222c vary the thermal environment between first phase change portion 214a, which is surrounded by spacers 222a-222c, second phase change portion 214b, which is surrounded by first spacer or spacer pair 222a and second spacer or spacer pair 222b, and third phase change portion 210c, which is surrounded by first spacer or spacer pair 222a. Spacers 222a-222c include any suitable dielectric material, such as a low-k material. In one embodiment, spacers 222a-222c have a lower thermal conductivity than insulation material 208. By varying the thermal environment between phase change portions 214a-214c, the temperature induced within each phase change portion 214a-214c is further controlled during programming. Phase change memory cell 220a operates similarly to phase change memory cell 200a previously described and illustrated with reference to FIG. 2A.

Figure 3B:
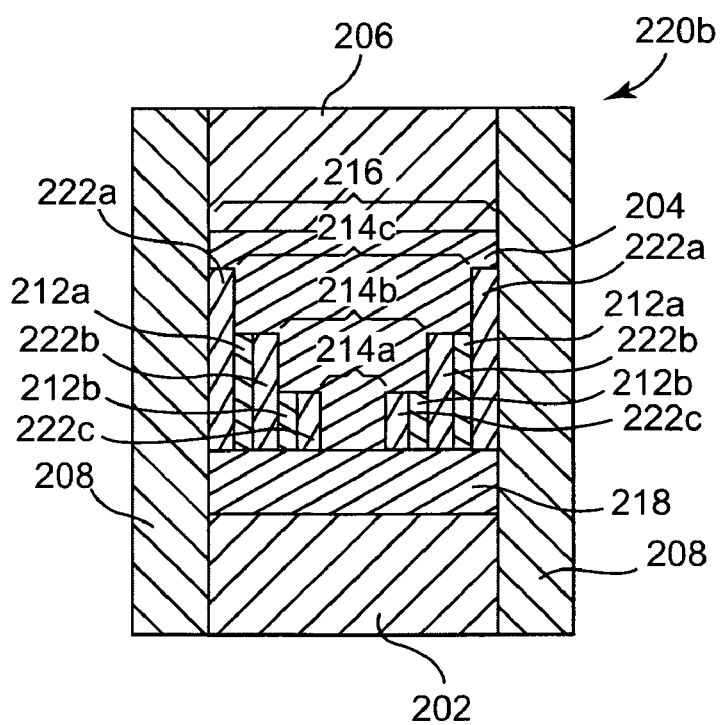
FIG. 3B illustrates a cross-sectional view of another embodiment of a phase change memory cell.

FIG. 3B illustrates a cross-sectional view of another embodiment of a phase change memory cell 220b. In one embodiment, each of the memory cells 106a-106d is similar to phase change memory cell 220b. Phase change memory cell 220b is similar to phase change memory cell 220a previously described and illustrated with reference to FIG. 3A, except that phase change memory cell 220b includes the addition of diffusion barrier 218. Phase change memory cell 220b operates similarly to phase change memory cell 200a previously described and illustrated with reference to FIG. 2A.

Figure 4A:
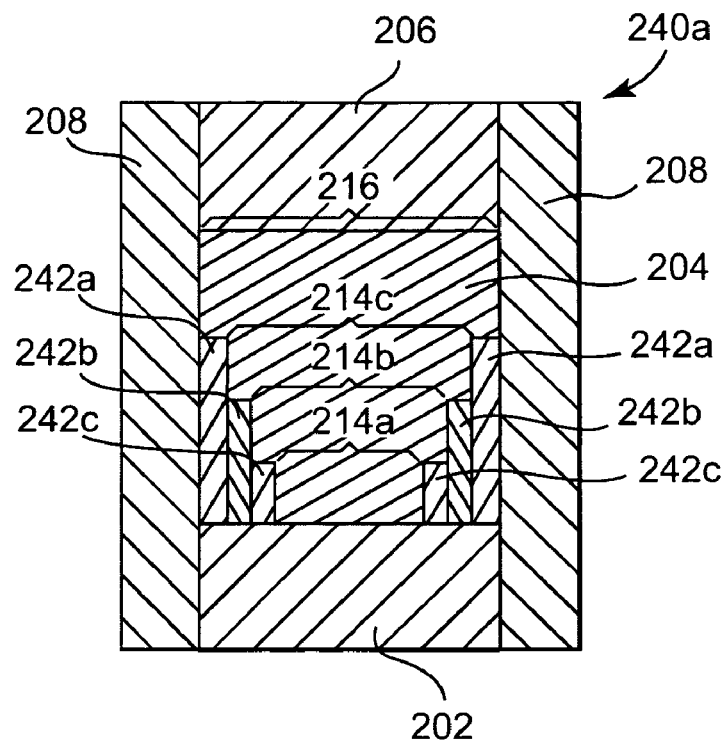
FIG. 4A illustrates a cross-sectional view of another embodiment of a phase change memory cell.

FIG. 4A illustrates a cross-sectional view of another embodiment of a phase change memory cell 240a. In one embodiment, each of the memory cells 106a-106d is similar to phase change memory cell 240a. Phase change memory cell 240a is similar to phase change memory cell 220a previously described and illustrated with reference to FIG. 3A, except that in phase change memory cell 240a spacers 222a-222c and etch stop layers 212a and 212b are replaced with spacers 242a-242c.

Insulation material 208 laterally completely encloses phase change material 204, first electrode 202, second electrode 206, and spacers 242a-242c. Insulation material 208 contacts the sides of additional phase change material 216 and first spacer or spacer pair 242a. First spacer or spacer pair 242a contacts and defines third phase change portion 214c. First spacer or spacer pair 242a contacts second spacer or spacer pair 242b. Second spacer or spacer pair 242b contacts and defines second phase change portion 214b. Second spacer or spacer pair 242b contacts third spacer or spacer pair 242c. Third spacer or spacer pair 242c contacts and defines first phase change portion 214a. Second spacer or spacer pair 242b is shorter than first spacer or spacer pair 242a. Third spacer or spacer pair 242c is shorter than second spacer or spacer pair 242b.

Spacers 242a-242c vary the thermal environment between first phase change portion 214a, which is surrounded by spacers 242a-242c, second phase change portion 214b, which is surrounded by first spacer or spacer pair 242a and second spacer or spacer pair 242b, and third phase change portion 214c, which is surrounded by first spacer or spacer pair 242a. Each of the spacers 242a-242c include a different dielectric material, such as a low-k material. In one embodiment, spacers 242a-242c have a lower thermal conductivity than insulation material 208. By varying the thermal environment between phase change portions 214a-214c, the temperature induced within each phase change portion 214a-214c is further controlled during programming. Phase change memory cell 240a operates similarly to phase change memory cell 200a previously described and illustrated with reference to FIG. 2A.

Figure 4B:
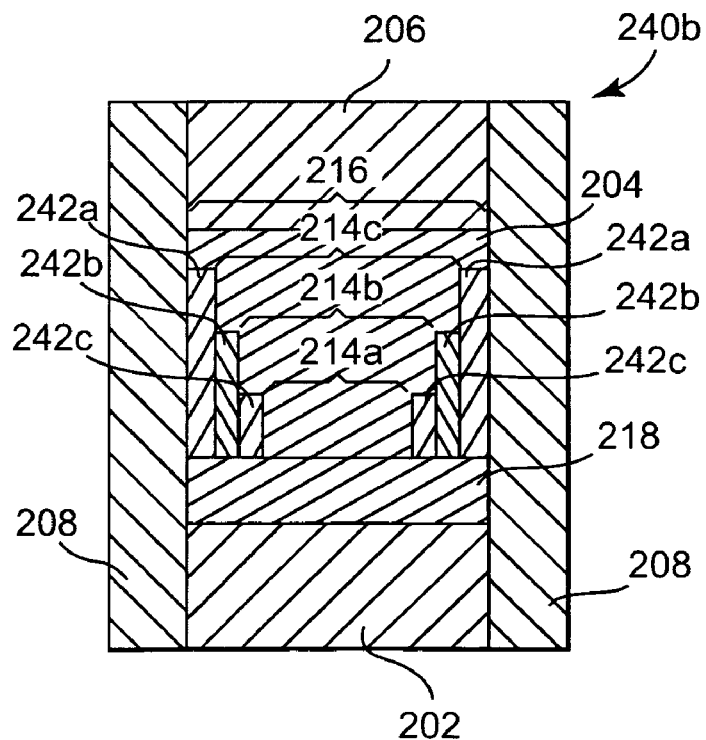
FIG. 4B illustrates a cross-sectional view of another embodiment of a phase change memory cell.

FIG. 4B illustrates a cross-sectional view of another embodiment of a phase change memory cell 240b. In one embodiment, each of the memory cells 106a-106d is similar to phase change memory cell 240b. Phase change memory cell 240b is similar to phase change memory cell 240a previously described and illustrated with reference to FIG. 4A, except that phase change memory cell 240b includes the addition of diffusion barrier 218. Phase change memory cell 240b operates similarly to phase change memory cell 200a previously described and illustrated with reference to FIG. 2A.

Figure 5A:
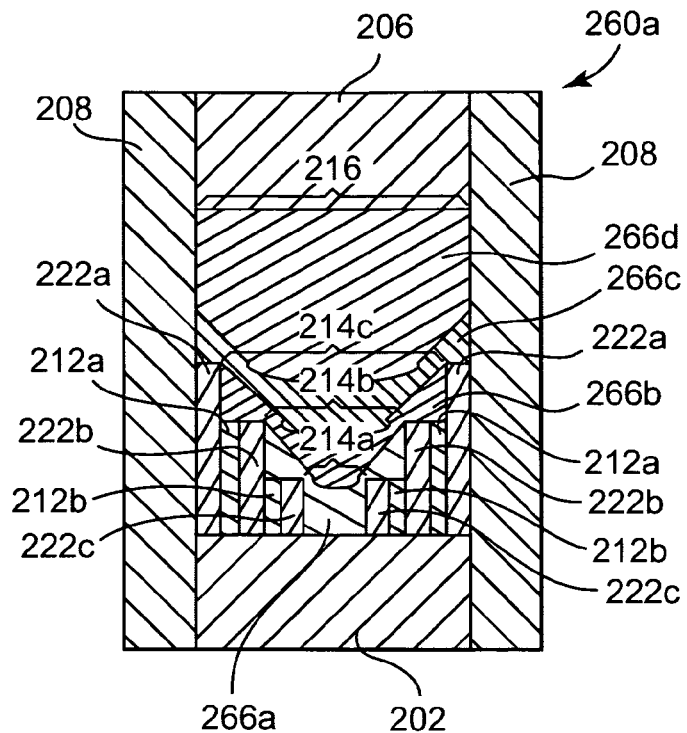
FIG. 5A illustrates a cross-sectional view of another embodiment of a phase change memory cell.

FIG. 5A illustrates a cross-sectional view of another embodiment of a phase change memory cell 260a. In one embodiment, each of the memory cells 106a-106d is similar to phase change memory cell 260a. Phase change memory cell 260a is similar to phase change memory cell 220a previously described and illustrated with reference to FIG. 3A, except that in phase change memory cell 260a phase change material 204 is replaced with phase change material 266a-266d. First phase change portion 214a includes first phase change material 266a. Second phase change portion 214b includes second phase change material 266b. Third phase change portion 214c includes third phase change material 266c. Additional phase change material 216 includes fourth phase change material 266d. In another embodiment, phase change portions 214a-214c and additional phase change material 216 includes two or more suitable phase change materials 266.

Phase change materials 266a-266c for phase change portions 214a-214c have different crystallization temperatures. By varying the crystallization temperature between the phase change portions 214a-214c, the transition of each phase change portion 214a-214c is further controlled during programming.

Spacers 222a-222c have similar dielectric material compositions and functions as the corresponding spacer pairs 222a-222c previously described and illustrated with reference to FIG. 3A. In another embodiment, spacer pairs 222a-222c have similar dielectric material compositions and functions as the corresponding spacer pairs 210a-210c previously described and illustrated with reference with FIG. 2A. In another embodiment, spacers 222a-222c have similar dielectric material compositions and functions as the corresponding spacers 242a-242c previously described and illustrated with reference to FIG. 4A. Phase change memory cell 260a operates similarly to phase change memory cell 200a previously described and illustrated with reference to FIG. 2A.

Figure 5B:
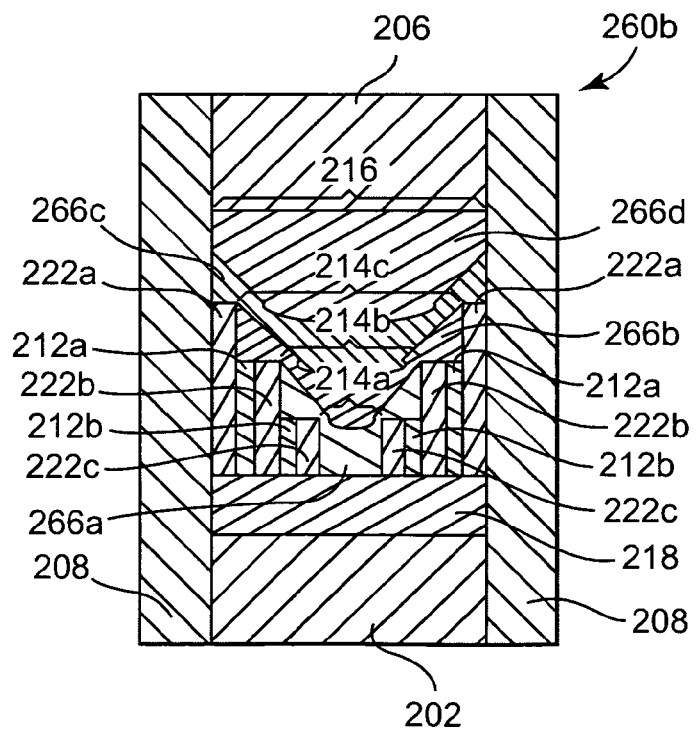
FIG. 5B illustrates a cross-sectional view of another embodiment of a phase change memory cell.

FIG. 5B illustrates a cross-sectional view of another embodiment of a phase change memory cell 260b. In one embodiment, each of the memory cells 106a-106d is similar to phase change memory cell 260b. Phase change memory cell 260b is similar to phase change memory cell 260a previously described and illustrated with reference to FIG. 5A, except that phase change memory cell 260b includes the addition of diffusion barrier 218. Phase change memory cell 260a operates similarly to phase change memory cell 200a previously described and illustrated with reference to FIG. 2A.

Figure 6A:
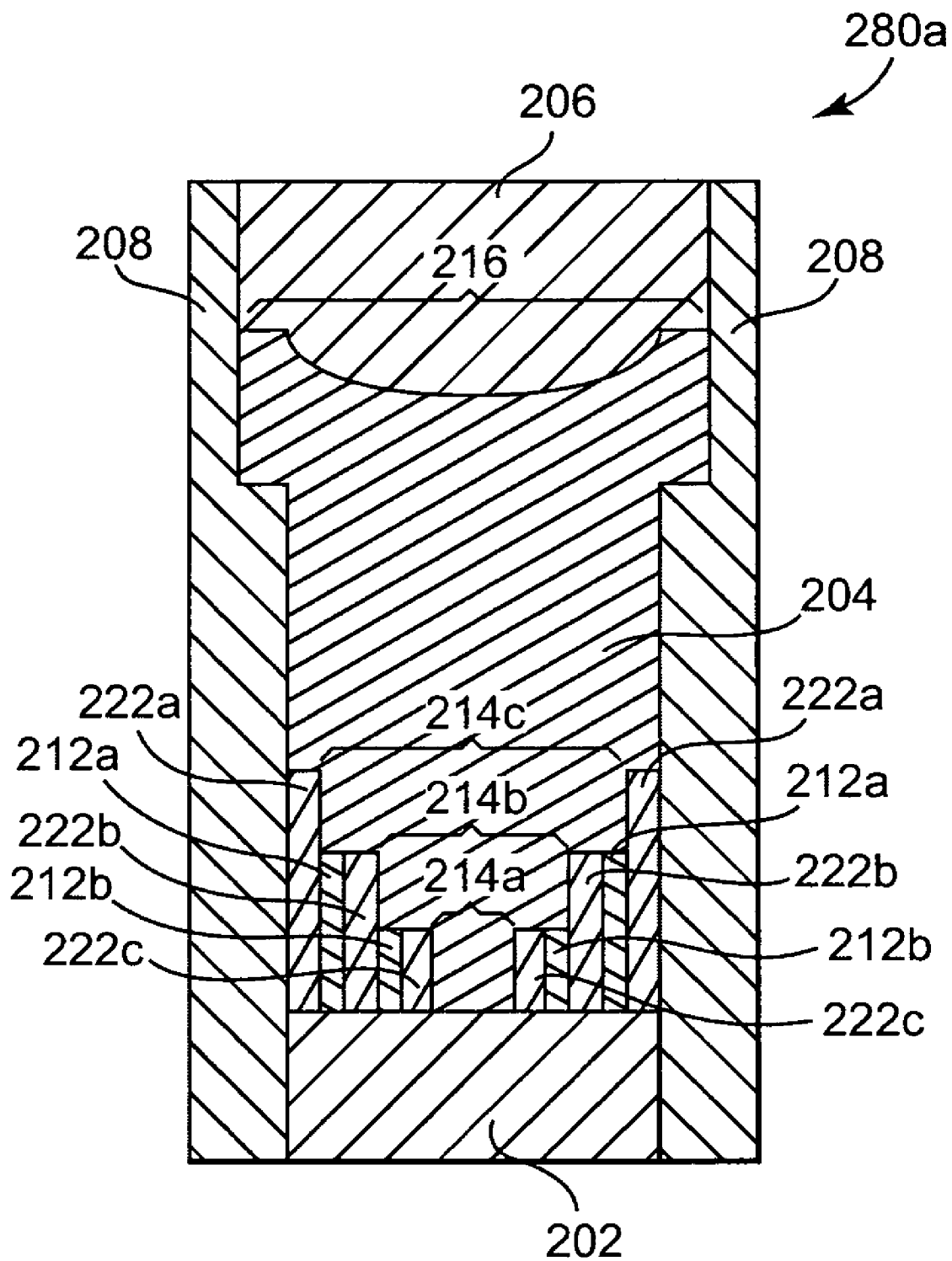
FIG. 6A illustrates a cross-sectional view of another embodiment of a phase change memory cell.

FIG. 6A illustrates a cross-sectional view of another embodiment of a phase change memory cell 280a. In one embodiment, each of the memory cells 106a-106d is similar to phase change memory cell 280a. Phase change memory cell 280a is similar to phase change memory cell 220a previously described and illustrated with reference to FIG. 3A, except that phase change memory cell 280a includes an extended two step additional phase change material portion 216.

In another embodiment, spacers 222a-222c have similar dielectric material compositions and functions as the corresponding spacers 210a-210c previously described and illustrated with reference to FIG. 2A. In another embodiment, spacers 222a-222c have similar dielectric material compositions and functions as the corresponding spacers 242a-242c previously described and illustrated with reference to FIG. 4A. Phase change memory cell 280a operates similarly to phase change memory cell 200a previously described and illustrated with reference to FIG. 2A.

Figure 6B:
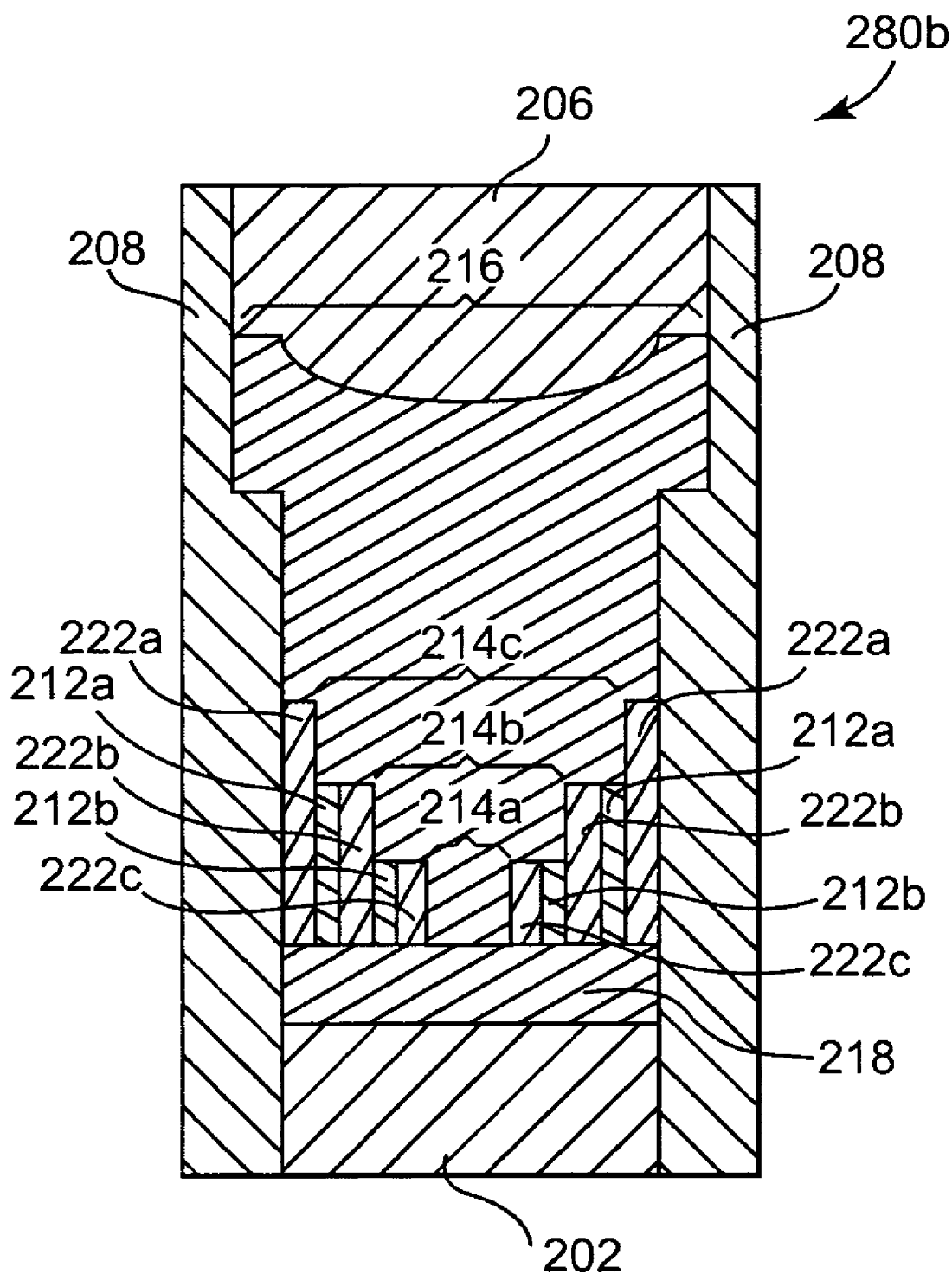
FIG. 6B illustrates a cross-sectional view of another embodiment of a phase change memory cell.

FIG. 6B illustrates a cross-sectional view of another embodiment of a phase change memory cell 280b. In one embodiment, each of the memory cells 106a-106d is similar to phase change memory cell 280b. Phase change memory cell 280b is similar to phase change memory cell 280a previously described and illustrated with reference to FIG. 6A, except that phase change memory cell 280b includes the addition of diffusion barrier 218. Phase change memory cell 280b operates similarly to phase change memory cell 200a previously described and illustrated with reference to FIG. 2A.

The following FIGS. 7-29 illustrate embodiments of a method for fabricating a phase change memory cell including phase change material forming a step-like pattern, such as phase change memory cell 200a previously described and illustrated with reference to FIG. 2A, phase change memory cell 200b previously described and illustrated with reference to FIG. 2B, phase change memory cell 220a previously described and illustrated with reference to FIG. 3A, and phase change memory cell 220b previously described and illustrated with reference to FIG. 3B.

Figure 7:
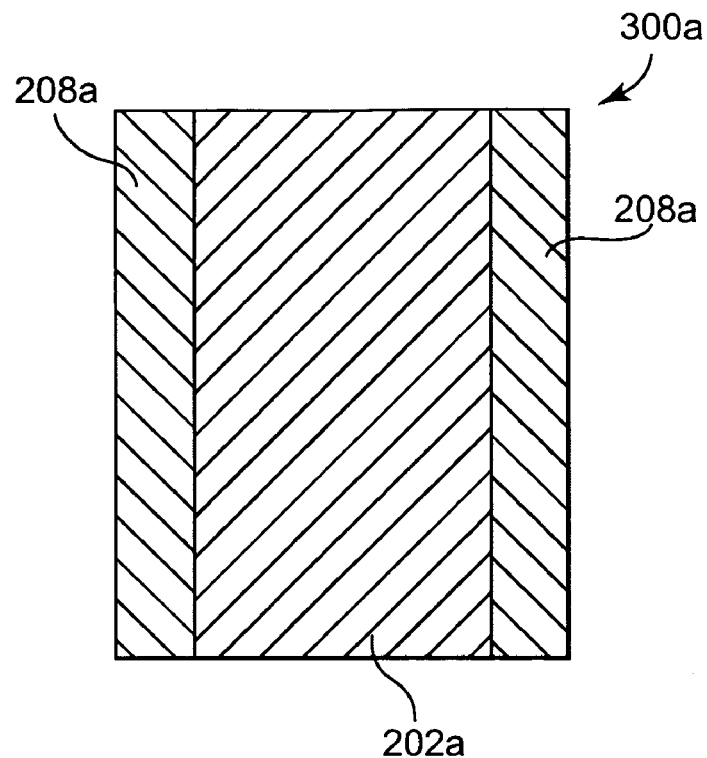
FIG. 7 illustrates a cross-sectional view of one embodiment of a preprocessed wafer.

FIG. 7 illustrates a cross-sectional view of one embodiment of a preprocessed wafer 300a. Preprocessed wafer 300a includes an electrode material layer 202a, an insulation material layer 208a, and lower wafer layers (not shown). Electrode material layer 202a includes any suitable electrode material, such as TiN, TaN, W, Al, or Cu. Electrode material layer 202a is laterally surrounded by insulation material 208a, such as SiO$_2$, FSG, BPSG, BSG, low-k material, or other suitable dielectric material.

Figure 8:
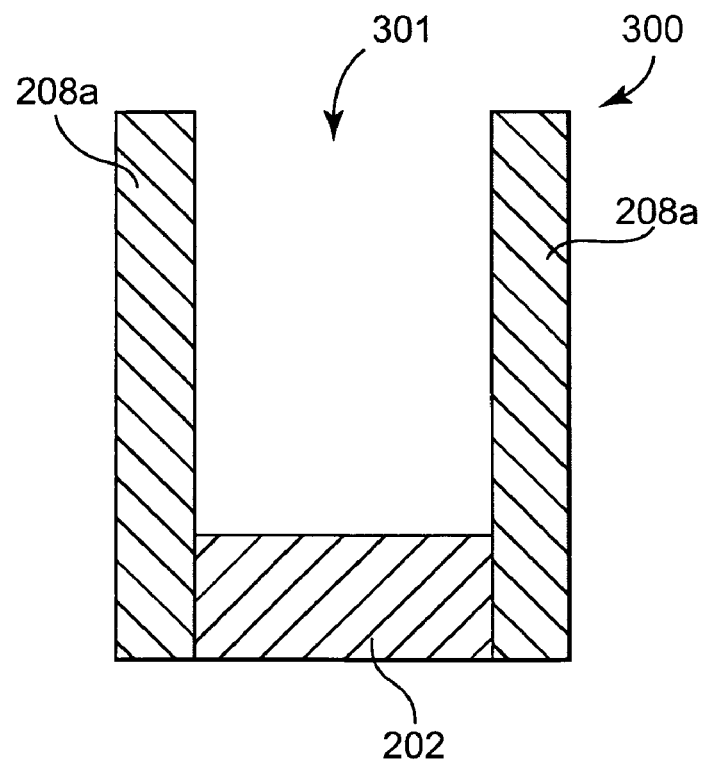
FIG. 8 illustrates a cross-sectional view of one embodiment of a memory cell portion after etching an electrode material layer.

FIG. 8 illustrates a cross-sectional view of one embodiment of memory cell portion 300 after etching electrode material layer 202a. Electrode material layer 202a is etched to provide opening 301 to form first electrode 202. Insulation material 208a electrically isolates first electrode 202 from adjacent device features. In one embodiment, opening 301 is a cylindrical contact-like opening substantially centered over first electrode 202. In another embodiment, opening 301 is a trench opening substantially centered over several first electrodes 202 in a row.

Figure 9:
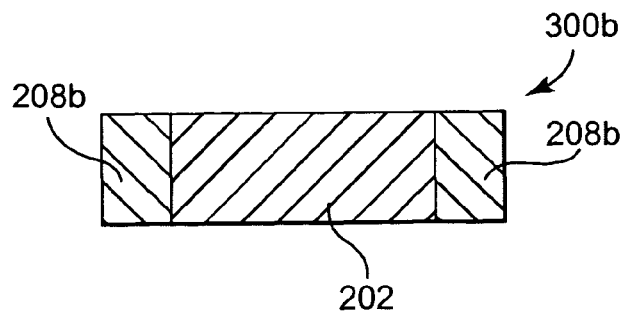
FIG. 9 illustrates a cross-sectional view of another embodiment of a preprocessed wafer.

FIG. 9 illustrates a cross-sectional view of another embodiment of a preprocessed wafer 300b. Preprocessed wafer 300b includes first electrode 202, first insulation material layer 208b, and lower wafer layers (not shown). In one embodiment, first electrode 202 is a contact plug, such as a tungsten plug, copper plug, or other suitable conducting material plug. First electrode 202 is laterally surrounded by first insulation material layer 208b, such as SiO$_2$, FSG, BPSG, BSG, low-k material, or other suitable dielectric material.

Figure 10:
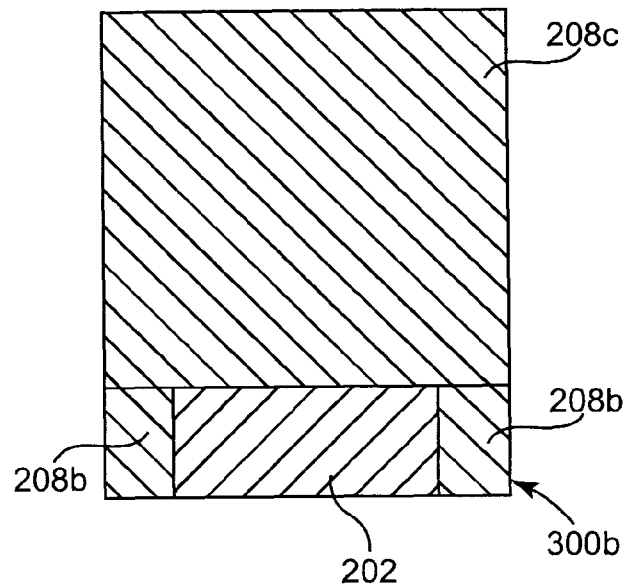
FIG. 10 illustrates a cross-sectional view of one embodiment of the preprocessed wafer and a second insulation material layer.

FIG. 10 illustrates a cross-sectional view of one embodiment of preprocessed wafer 300b and a second insulation material layer 208c. Insulation material, such as SiO$_2$, FSG, BPSG, BSG, low-k material, or other suitable dielectric material, is deposited over preprocessed wafer 300b to provide second insulation material layer 208c. Second insulation material layer 208c is deposited using, chemical vapor deposition (CVD), atomic layer deposition (ALD), metal organic chemical vapor deposition (MOCVD), plasma vapor deposition (PVD), jet vapor deposition (JVP), or other suitable deposition technique.

Figure 11:
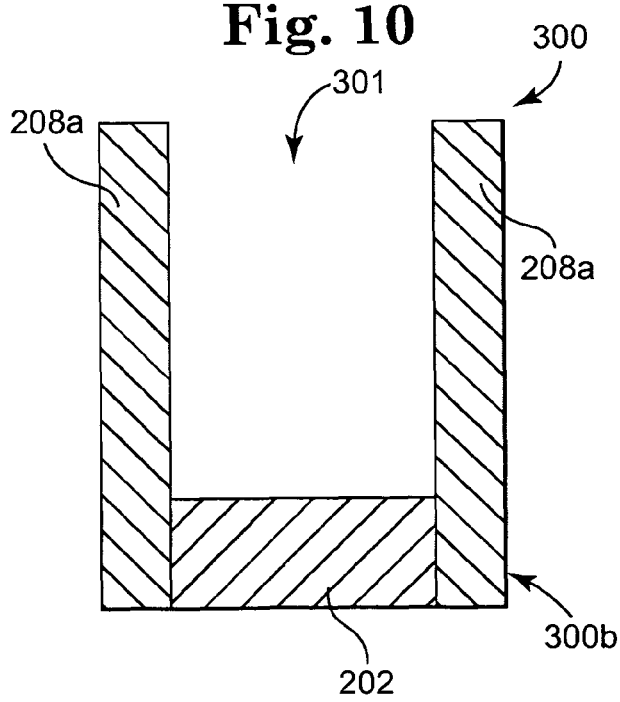
FIG. 11 illustrates a cross-sectional view of one embodiment a memory cell portion after etching the second insulation material layer.

FIG. 11 illustrates a cross-sectional view of one embodiment of memory cell portion 300 after etching second insulation material layer 208c. Second insulation material layer 208c is etched to expose first electrode 202 to provide opening 301 and insulation material 208a. Insulation material 208a electrically isolates first electrode 202 from adjacent device features. Memory cell portion 300 illustrated in FIG. 11 is similar to memory cell portion 300 illustrated in FIG. 8, but the memory cell portions are formed using different methods. In one embodiment, opening 301 is a cylindrical contact-like opening substantially centered over first electrode 202. In another embodiment, opening 301 is a trench opening substantially centered over several first electrodes 202 in a row.

Figure 12:
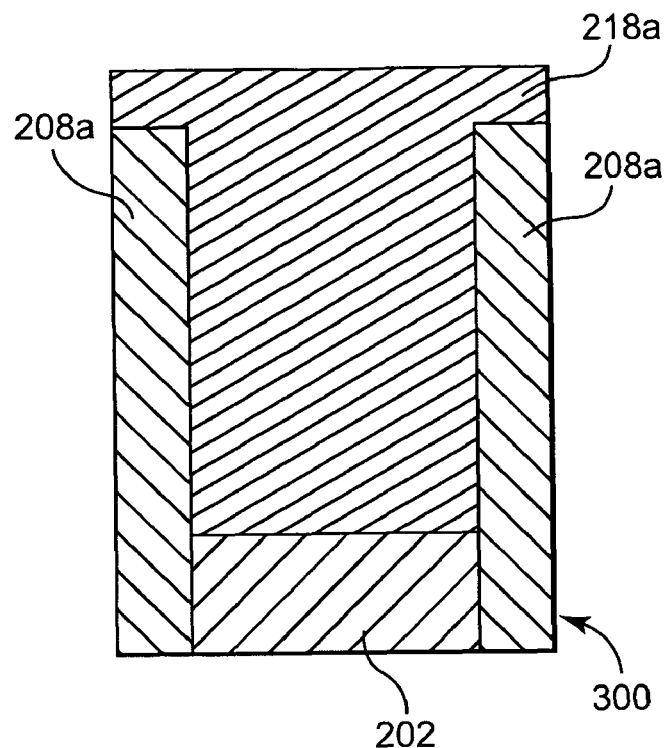
FIG. 12 illustrates a cross-sectional view of one embodiment of the memory cell portion and a diffusion barrier material layer.

FIG. 12 illustrates a cross-sectional view of one embodiment of memory cell portion 300 and a diffusion barrier material layer 218a. Diffusion barrier material, such as a chalcogenide compound material or other suitable phase change material, is deposited over exposed portions of memory cell portion 300 to provide diffusion barrier material layer 218a. Diffusion barrier material layer 218a is deposited using CVD, ALD, MOCVD, PVD, JVP, or other suitable deposition technique.

Figure 13:
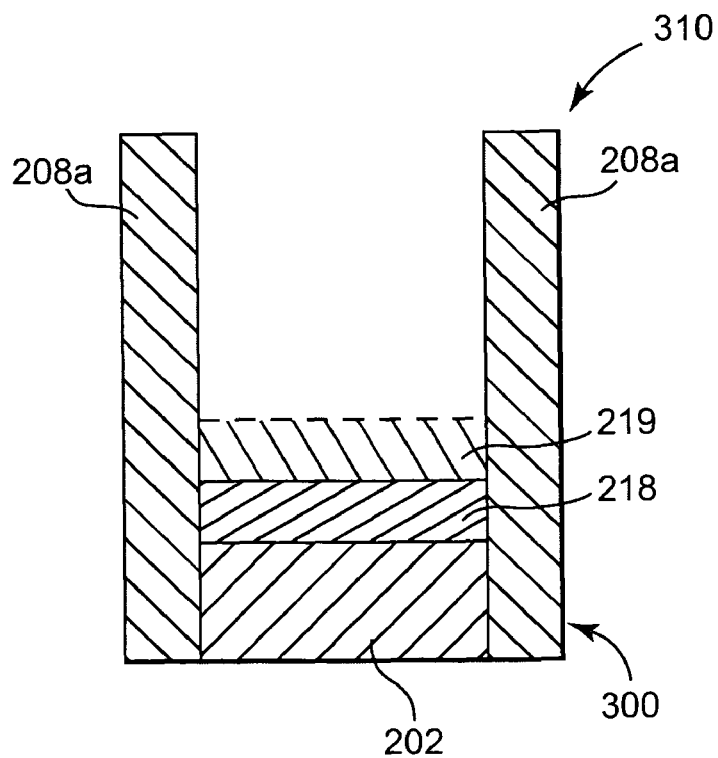
FIG. 13 illustrates a cross-sectional view of one embodiment of the memory cell portion and a diffusion barrier after etching the diffusion barrier material layer.

FIG. 13 illustrates a cross-sectional view of one embodiment of an alternate memory cell portion 310 after etching diffusion barrier material layer 218a. Diffusion barrier material layer 218a is etched to provide diffusion barrier 218 contacting first electrode 202 to provide alternate memory cell portion 310. In one embodiment, an optional electrode material, such as TiN, TaN, TiSiN, and TiAlN, is deposited over exposed portions of memory cell portion 300 and diffusion barrier 218. The electrode material is etched to provide optional diffusion barrier 219 of alternate memory cell portion 310. While the remaining FIGS. 14-44 illustrate embodiments of methods for fabricating phase change memory cells using memory cell portion 300, alternate memory cell portion 310 can be used in place of memory cell portion 300.

Figure 14:
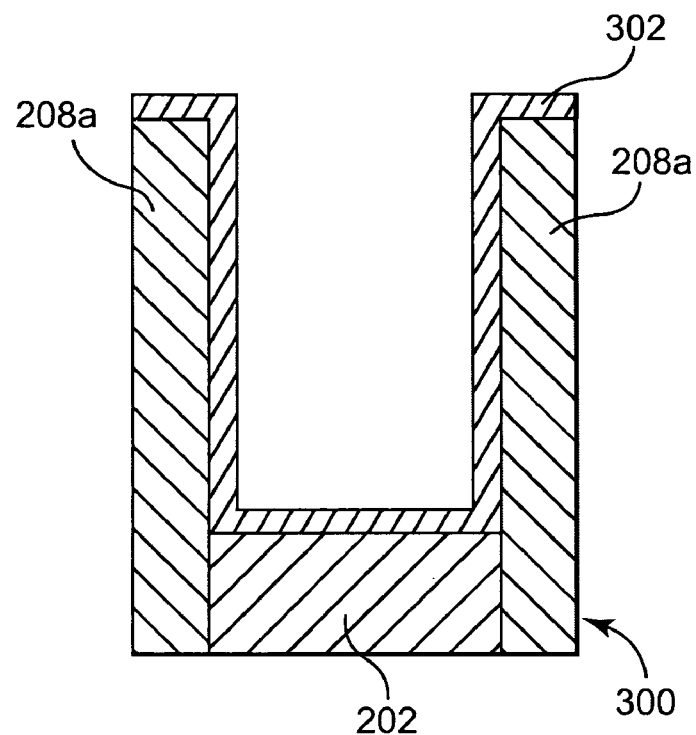
FIG. 14 illustrates a cross-sectional view of one embodiment of the memory cell portion and a first spacer material layer.

FIG. 14 illustrates a cross-sectional view of one embodiment of memory cell portion 300 and a first spacer material layer 302. Spacer material, such as SiO$_2$, FSG, BPSG, BSG, low-k material, or other suitable dielectric material, is conformally deposited over memory cell portion 300 to provide first spacer material layer 302. First spacer material layer 302 is deposited using CVD, ALD, MOCVD, PVD, JVP, or other suitable deposition technique.

Figure 15:
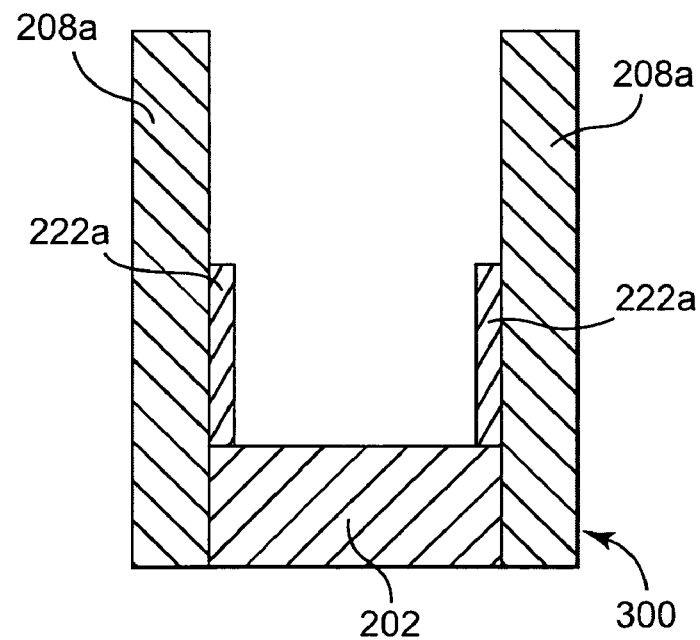
FIG. 15 illustrates a cross-sectional view of one embodiment of the memory cell portion and a first spacer or spacer pair after etching the first spacer material layer.

FIG. 15 illustrates a cross-sectional view of one embodiment of memory cell portion 300 and a first spacer or spacer pair 222a after etching first spacer material layer 302. First spacer material layer 302 is etched to expose a portion of the sidewalls of insulation material 208a and first electrode 202 to provide first spacer or spacer pair 222a.

Figure 16:
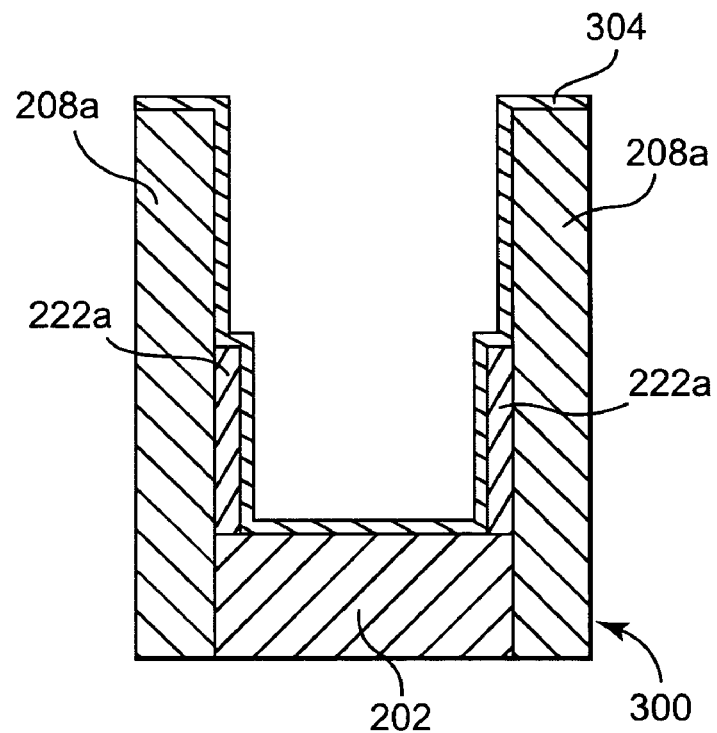
FIG. 16 illustrates a cross-sectional view of one embodiment of the memory cell portion, first spacer or spacer pair, and an etch stop material layer.

FIG. 16 illustrates a cross-sectional view of one embodiment of memory cell portion 300, first spacer or spacer pair 222a, and an etch stop material layer 304. Etch stop material, such as SiN or other suitable material with etch selectivity with respect to first spacer pair 222a, is conformally deposited over exposed portions of memory cell portion 300 and first spacer or spacer pair 222a to provide etch stop material layer 304. Etch stop material layer 304 is deposited using CVD, ALD, MOCVD, PVD, JVP, or other suitable deposition technique.

Figure 17:
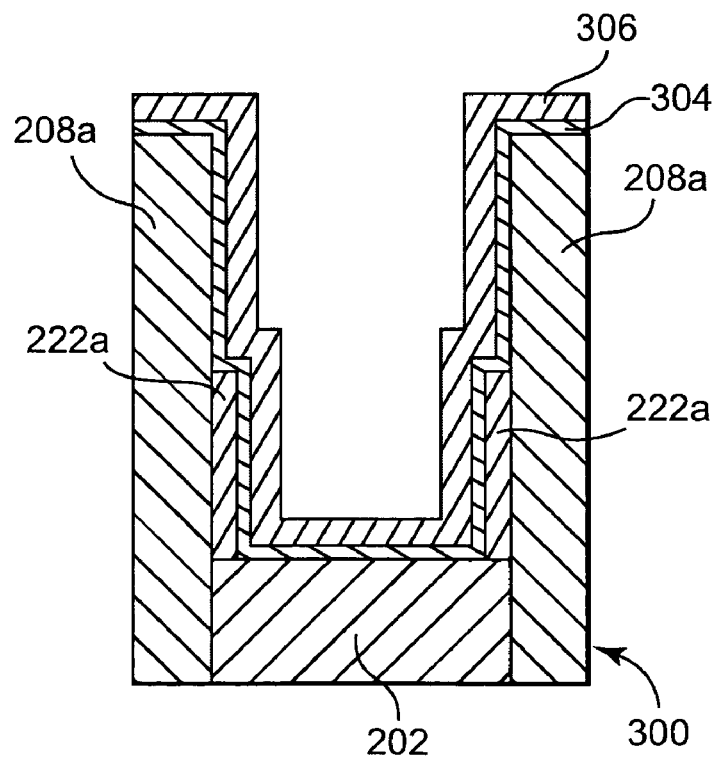
FIG. 17 illustrates a cross-sectional view of one embodiment of the memory cell portion, first spacer or spacer pair, etch stop material layer, and a second spacer material layer.

FIG. 17 illustrates a cross-sectional view of one embodiment of memory cell portion 300, first spacer or spacer pair 222a, etch stop material layer 304, and a second spacer material layer 306. Spacer material, such as SiO$_2$, FSG, BPSG, BSG, low-k material, or other suitable dielectric material, is conformally deposited over etch stop material layer 304 to provide second spacer material layer 306. Second spacer material layer 306 is deposited using CVD, ALD, MOCVD, PVD, JVP, or other suitable deposition technique.

Figure 18:
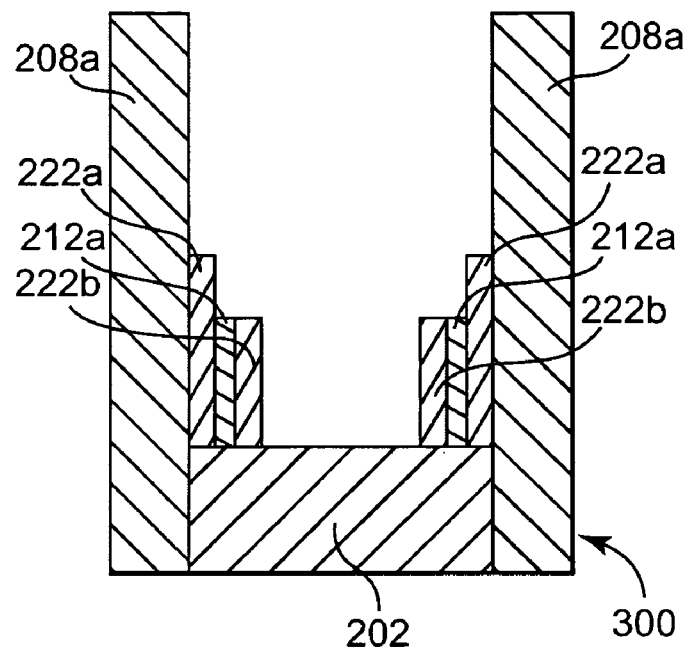
FIG. 18 illustrates a cross-sectional view of one embodiment of the memory cell portion, first spacer or spacer pair, a first etch stop layer or layer pair, and a second spacer or spacer pair after etching the second spacer material layer and the etch stop material layer.

FIG. 18 illustrates a cross-sectional view of one embodiment of memory cell portion 300, first spacer or spacer pair 222a, first etch stop layer or layer pair 212a, and second spacer or spacer pair 222b after etching second spacer material layer 306 and etch stop material layer 304. Second spacer material layer 306 is etched to provide second spacer or spacer pair 222b, which is shorter than first spacer or spacer pair 222a. First spacer or spacer pair 222a is unaffected during etching of second spacer material layer 306 since etch stop material layer 304 prevents further etching of first spacer or spacer pair 222a. Etch stop material 304 is then etched to expose first spacer or spacer pair 222a and first electrode 202 to provide first etch stop layer or layer pair 212a.

Figure 19:
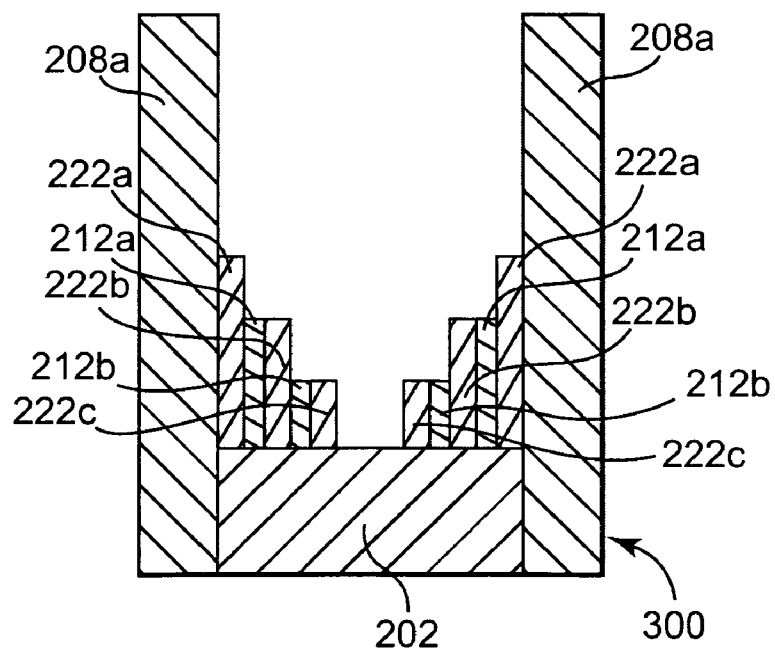
FIG. 19 illustrates a cross-sectional view of one embodiment of the memory cell portion, first spacer or spacer pair, first etch stop layer or layer pair, second spacer or spacer pair, a second etch stop layer or layer pair, and a third spacer or spacer pair.

FIG. 19 illustrates a cross-sectional view of one embodiment of memory cell portion 300, spacers 222a-222c, and etch stop layers 212a and 212b. Spacers 222a-222c include first spacer or spacer pair 222a, second spacer or spacer pair 222b, and a third spacer or spacer pair 222c. Etch stop layers 212a and 212b include first etch stop layer or layer pair 212a and a second etch stop layer or layer pair 212b.

The process of depositing an etch stop material layer, depositing a spacer material layer, etching the spacer material layer, and etching the etch stop material layer as illustrated in FIGS. 16-18 is repeated multiple times to provide spacers 222a-222c and etch stop layers 212a and 212b. In one embodiment, the process of depositing an etch stop material layer, depositing a spacer material layer, etching the spacer material layer, and etching the etch stop material layer is repeated any suitable number of times to provide a desired number of spacers 222 and etch stop layers 212 forming a step-like pattern. In another embodiment, spacers 222a-222c are replaced in the process described and illustrated with reference to FIGS. 14-19 with spacers 210a-210c.

Figure 20:
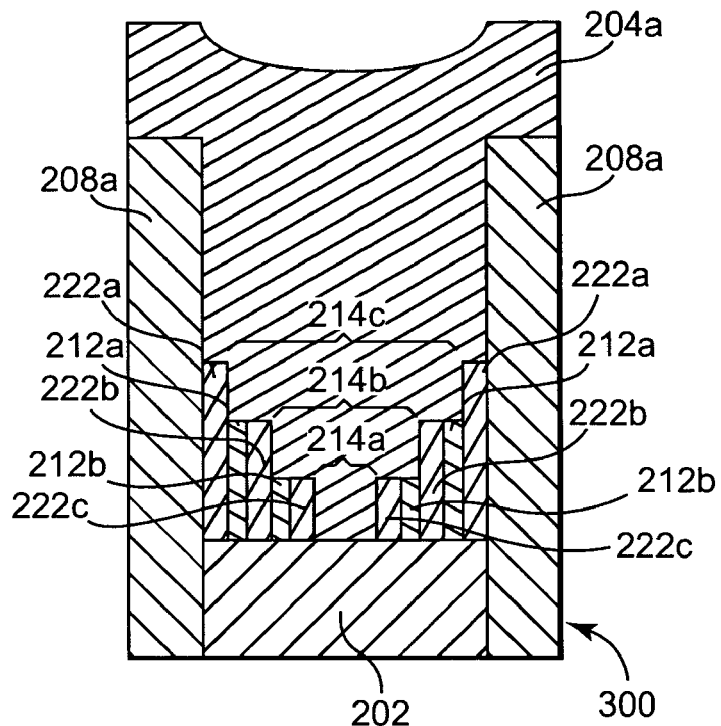
FIG. 20 illustrates a cross-sectional view of one embodiment of the memory cell portion, spacers, etch stop layers, and a phase change material layer.

FIG. 20 illustrates a cross-sectional view of one embodiment of memory cell portion 300, spacers 222a-222c, etch stop layers 212a and 212b, and a phase change material layer 204a. Phase change material, such as a chalcogenide compound material or other suitable phase change material, is deposited over exposed portions of memory cell portion 300, spacers 222a-222c, and etch stop layers 212a and 212b to provide phase change material layer 204a. Phase change material layer 204a is deposited using CVD, ALD, MOCVD, PVD, JVP, or other suitable deposition technique.

Phase change material layer 204a includes first phase change portion 214a, second phase change portion 214b, and a third phase change portion 214c. Third spacer or spacer pair 222c contacts and defines first phase change portion 214a. Second spacer or spacer pair 222b contacts and defines second phase change portion 214b. First spacer or spacer pair 222a contacts and defines third phase change portion 214c.

Figure 21:
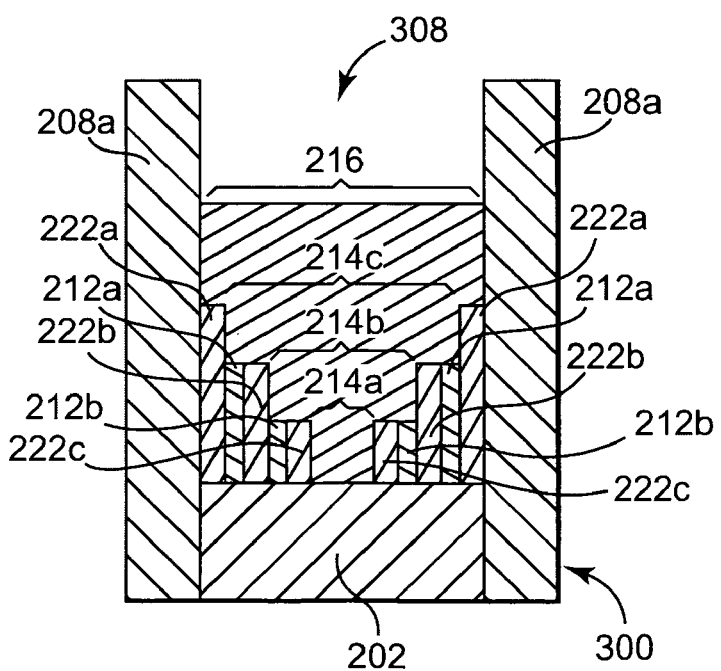
FIG. 21 illustrates a cross-sectional view of one embodiment of the memory cell portion, spacers, etch stop layers, and phase change material after etching the phase change material layer.

FIG. 21 illustrates a cross-sectional view of one embodiment of memory cell portion 300, spacers 222a-222c, etch stop layers 212a and 212b, and phase change material 204 after etching phase change material layer 204a. Phase change material layer 204a is etched to expose a portion of the sidewalls of insulation material 208a to provide opening 308 and phase change material 204. Phase change material 204 includes first phase change portion 214a, second phase change portion 214b, third phase change portion 214c, and additional phase change material 216.

Figure 22:
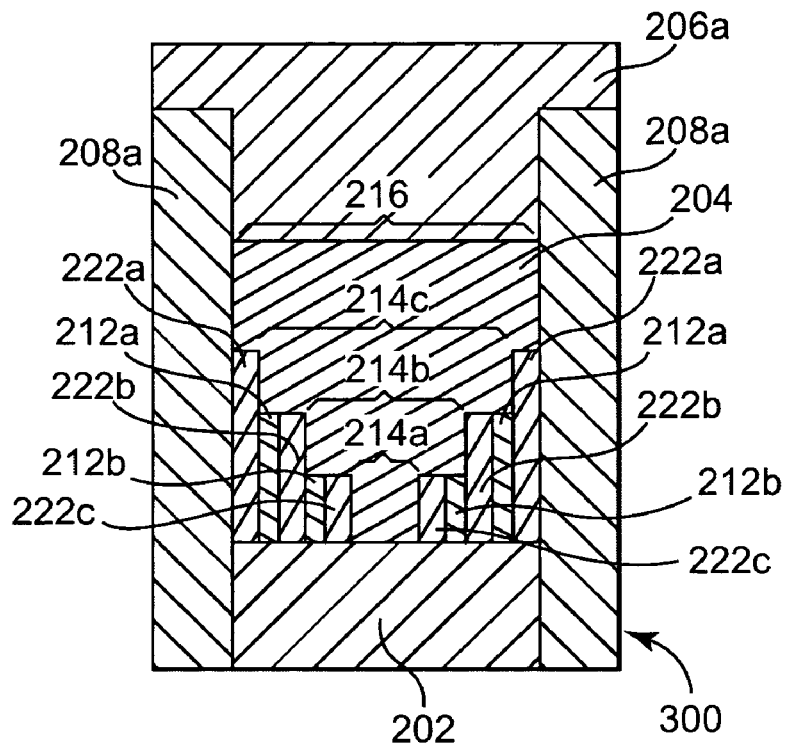
FIG. 22 illustrates a cross-sectional view of one embodiment of the memory cell portion, spacers, etch stop layers, phase change material, and an electrode material layer.

FIG. 22 illustrates a cross-sectional view of one embodiment of memory cell portion 300, spacers 222a-222c, etch stop layers 212a and 212b, phase change material 204, and an electrode material layer 206a. Electrode material, such as TiN, TaN, W, TiSiN, TiAlN, TaSiN, TaAlN, or other suitable electrode material, is deposited over exposed portions of memory cell portion 300 and phase change material 204 to provide electrode material layer 206a. Electrode material layer 206a is deposited using CVD, ALD, MOCVD, PVD, JVP, or other suitable deposition technique.

Figure 23:
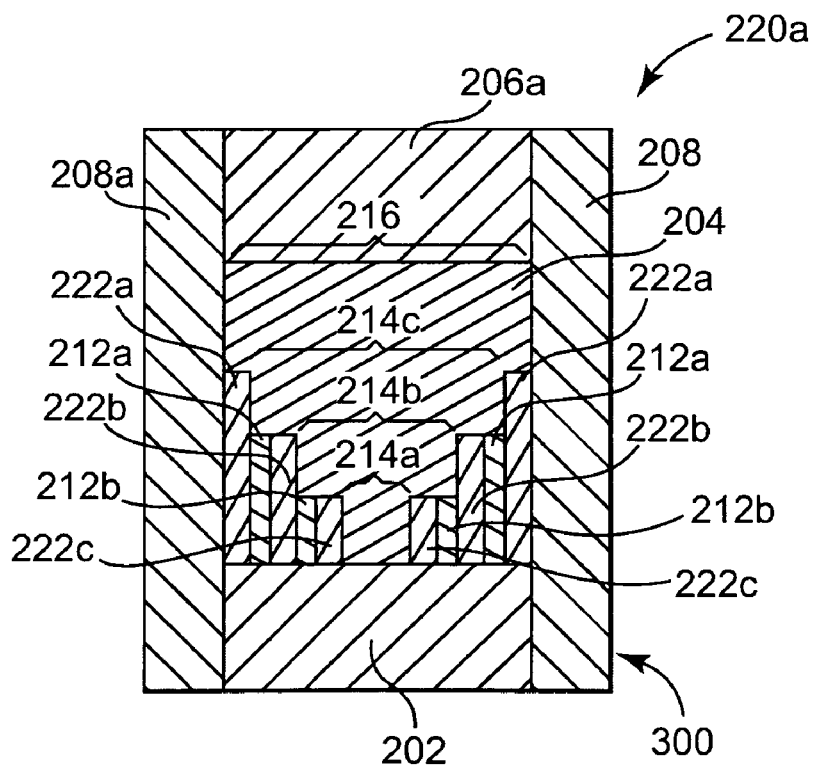
FIG. 23 illustrates a cross-sectional view of one embodiment of the memory cell portion, spacers, etch stop layers, phase change material, and a second electrode after planarizing the electrode material layer.

FIG. 23 illustrates a cross-sectional view of one embodiment of memory cell portion 300, spacers 222a-222c, etch stop layers 212a and 212b, phase change material 204, and second electrode 206 after planarizing electrode material layer 206a. Electrode material layer 206a is planarized using chemical mechanical planarization (CMP) or another suitable planarization technique to expose insulation material 208a to provide second electrode 206 and phase change memory cell 220a as illustrated in FIG. 3A.

In another embodiment, memory cell portion 300 is replaced with alternate memory cell portion 310 in the process described and illustrated with reference to FIGS. 14-23 to provide phase change memory cell 220b as illustrated in FIG. 3B.

In another embodiment, spacers 222a-222c are replaced in the process described and illustrated with reference to FIGS. 14-23 with spacers 210a-210c to provide phase change memory cell 200a as illustrated in FIG. 2A.

In another embodiment, spacers 222a-222c are replaced in the process described and illustrated with reference to FIGS. 14-23 with spacers 210a-210c, and memory cell portion 300 is replaced with alternate memory cell portion 310 in the process described and illustrated with reference to FIGS. 14-23 to provide phase change memory 200b as illustrated in FIG. 2B.

Figure 24:
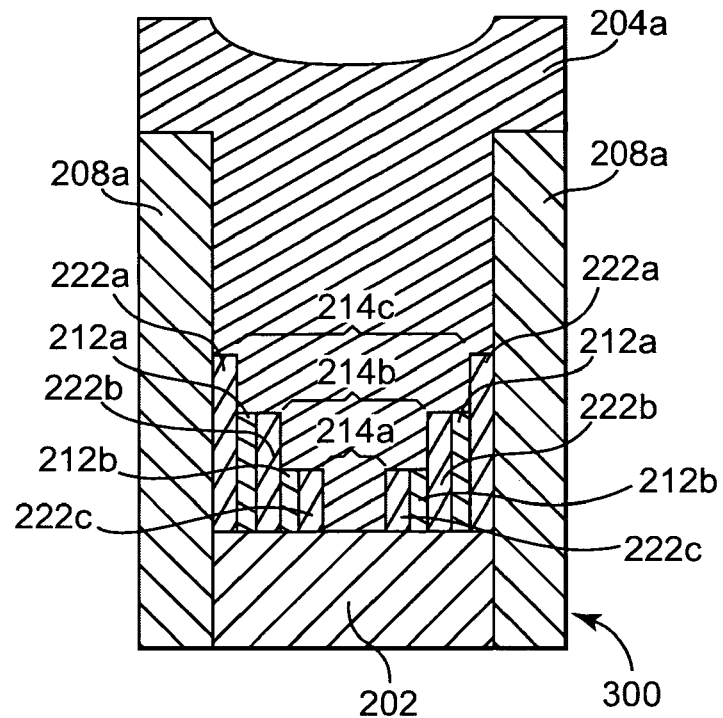
FIG. 24 illustrates a cross-sectional view of one embodiment of the memory cell portion, spacers, etch stop layers, and a phase change material layer as illustrated in FIG. 20.

FIG. 24 illustrates a cross-sectional view of one embodiment of memory cell portion 300, spacers 222a-222c, etch stop layers 212a and 212b, and phase change material layer 204a as illustrated in FIG. 20. Phase change material layer 204a includes first phase change portion 214a, second phase change portion 214b, and third phase change portion 214c. Third spacer or spacer pair 222c contacts and defines first phase change portion 214a. Second spacer or spacer pair 222b contacts and defines second phase change portion 214b. First spacer or spacer pair 222a contacts and defines third phase change portion 214c.

Figure 25:
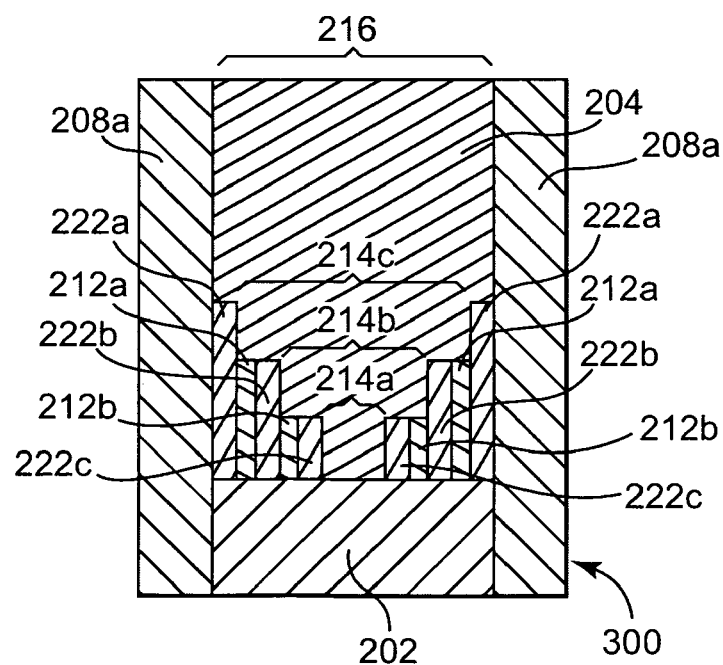
FIG. 25 illustrates a cross-sectional view of one embodiment of the memory cell portion, spacers, etch stop layers, and phase change material after planarizing the phase change material layer.

FIG. 25 illustrates a cross-sectional view of one embodiment of memory cell portion 300, spacers 222a-222c, etch stop layers 212a and 212b, and phase change material 204 after planarization. Phase change material layer 204a is planarized using CMP or another suitable planarization technique to expose insulation material 208a to provide phase change material 204. Phase change material 204 includes first phase change portion 214a, second phase change portion 214b, third phase change portion 214c, and additional phase change material 216.

Figure 26:
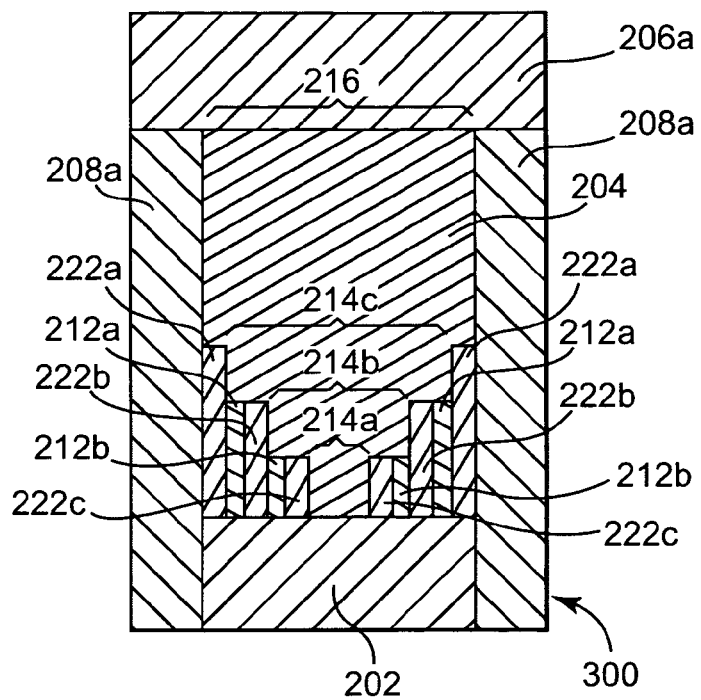
FIG. 26 illustrates a cross-sectional view of one embodiment of the memory cell portion, spacers, etch stop layers, phase change material, and an electrode material layer.

FIG. 26 illustrates a cross-sectional view of one embodiment of memory cell portion 300, spacers 222a-222c, etch stop layers 212a and 212b, phase change material 204, and an electrode material layer 206a. Electrode material, such as TiN, TaN, W, TiSiN, TiAlN, TaSiN, TaAlN, or other suitable electrode material, is deposited over phase change material layer 204 and insulation material 208a to provide electrode material layer 206a. Electrode material layer 206a is deposited using CVD, ALD, MOCVD, PVD, JVP, or other suitable deposition technique.

Figure 27:
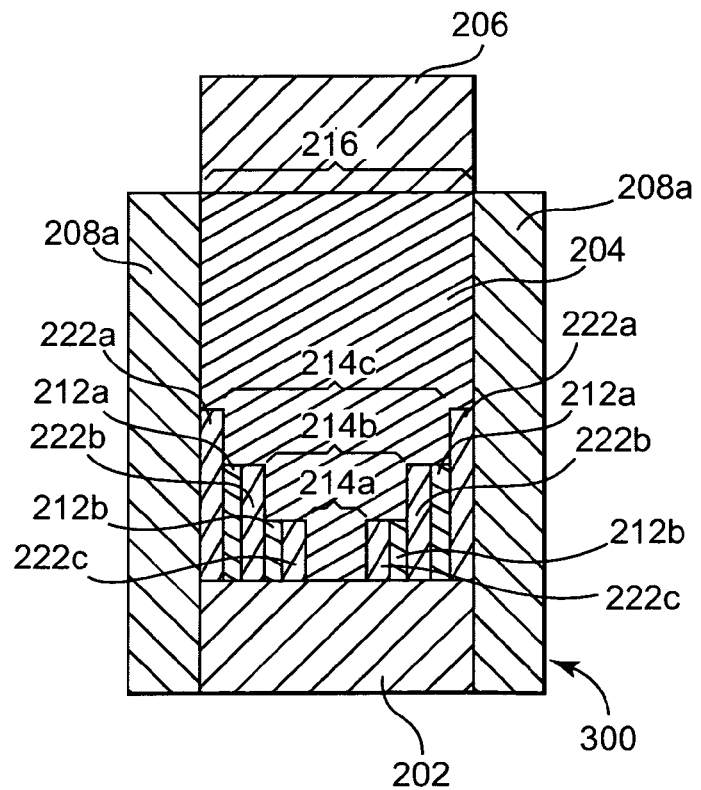
FIG. 27 illustrates a cross-sectional view of one embodiment of the memory cell portion, spacers, etch stop layers, phase change material, and a second electrode after etching the electrode material layer.

FIG. 27 illustrates a cross-sectional view of one embodiment of memory cell portion 300, spacers 222a-222c, etch stop layers 212a and 212b, phase change material 204, and second electrode 206 after etching electrode material layer 206a. Electrode material layer 206a is etched to expose insulation material 208a to provide second electrode 206.

Figure 28:
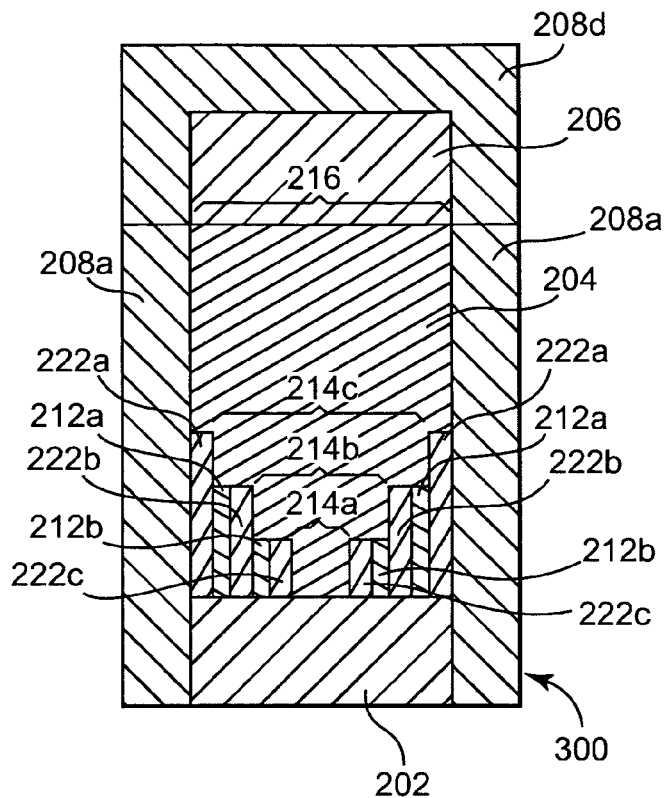
FIG. 28 illustrates a cross-sectional view of one embodiment of the memory cell portion, spacers, etch stop layers, phase change material, second electrode, and an additional insulation material layer.

FIG. 28 illustrates a cross-sectional view of one embodiment of memory cell portion 300, spacers 222a-222c, etch stop layers 212a and 212b, phase change material 204, second electrode 206, and an additional insulation material layer 208d. Insulation material, such as SiO$_2$, FSG, BPSG, BSG, low-k material, or other suitable dielectric material, is deposited over exposed portions of insulation material 208a and second electrode 206 to provide additional insulation material layer 208d. Additional insulation material layer 208d is deposited using CVD, ALD, MOCVD, PVD, JVP, or other suitable deposition technique.

Figure 29:
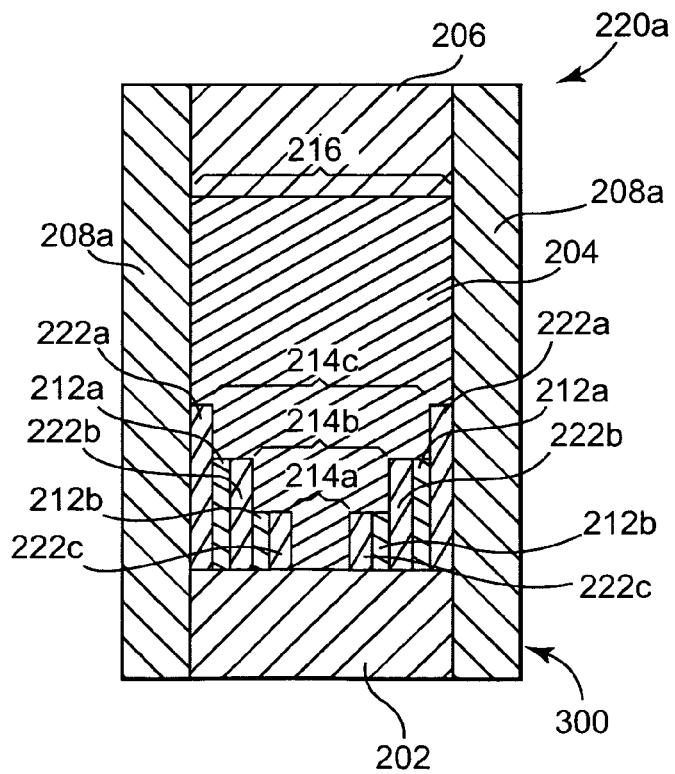
FIG. 29 illustrates a cross-sectional view of one embodiment of the memory cell portion, spacers, etch stop layers, phase change material, second electrode, and insulation material after etching the additional insulation material layer.

FIG. 29 illustrates a cross-sectional view of one embodiment of memory cell portion 300, spacers 222a-222c, etch stop layers 212a and 212b, phase change material 204, second electrode 206, and insulation material 208 after planarization. Additional insulation material layer 208d is planarized to expose second electrode 206 to provide insulation material 208 and phase change memory cell 220a as illustrated in FIG. 3A.

In another embodiment, memory cell portion 300 is replaced with alternate memory cell portion 310 in the process described and illustrated with reference to FIGS. 24-29 to provide phase change memory cell 220b as illustrated in FIG. 3B.

In another embodiment, spacers 222a-222c are replaced in the process described and illustrated with reference to FIGS. 24-29 with spacers 210a-210c to provide phase change memory cell 200a as illustrated in FIG. 2A.

In another embodiment, spacers 222a-222c are replaced in the process described and illustrated with reference to FIGS. 24-29 with spacers 210a-210c, and memory cell portion 300 is replaced with alternate memory cell portion 310 in the process described and illustrated with reference to FIGS. 24-29 to provide phase change memory cell 200b as illustrated in FIG. 2B.

The following FIGS. 30-34 illustrate embodiments of a method for fabricating a phase change memory cell including phase change material forming a step-like pattern, such as phase change memory cell 280a previously described and illustrated with reference to FIG. 6A and phase change memory cell 280b previously described and illustrated with reference to FIG. 6B.

Figure 30:
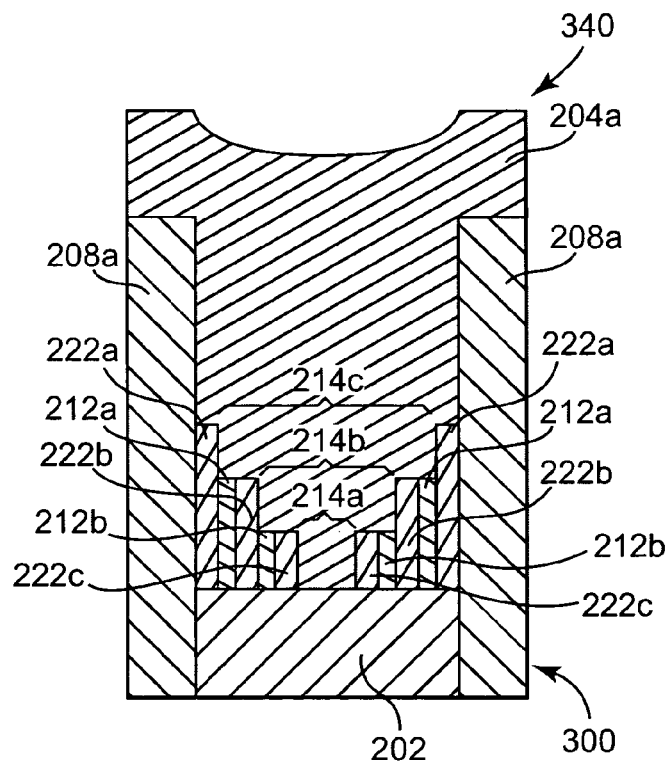
FIG. 30 illustrates a cross-sectional view of one embodiment of the memory cell portion, spacers, etch stop layers, and a phase change material layer as illustrated in FIG. 20.

FIG. 30 illustrates a cross-sectional view of one embodiment of memory cell portion 300, spacers 222a-222c, etch stop layers 212a and 212b, and phase change material layer 204a as illustrated in FIG. 20. Phase change material layer 204a includes first phase change portion 214a, second phase change portion 214b, and third phase change portion 214c. Third spacer or spacer pair 222c contacts and defines first phase change portion 214a. Second spacer or spacer pair 222b contacts and defines second phase change portion 214b. First spacer or spacer pair 222a contacts and defines third phase change portion 214c.

Figure 31:
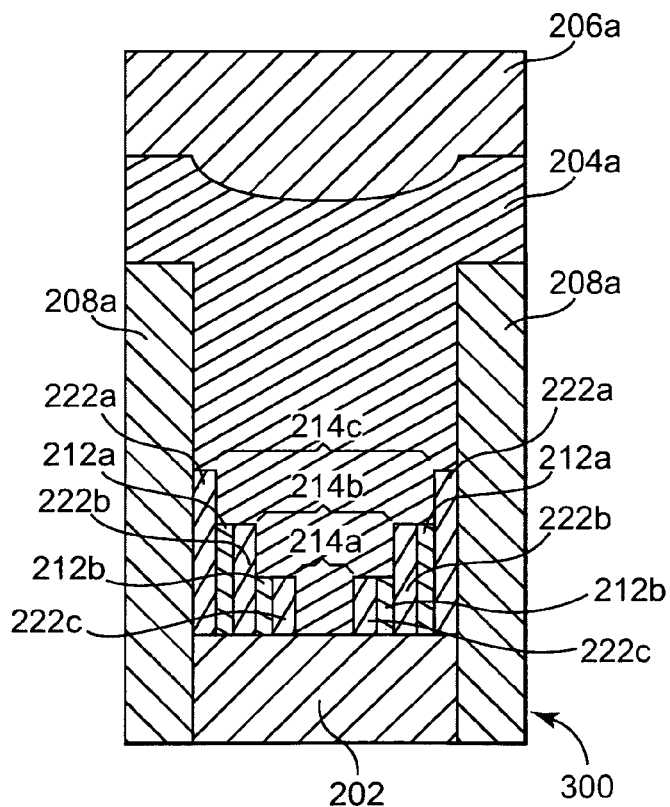
FIG. 31 illustrates a cross-sectional view of one embodiment of the memory cell portion, spacers, etch stop layers, phase change material layer, and an electrode material layer.

FIG. 31 illustrates a cross-sectional view of one embodiment of memory cell portion 300, spacers 222a-222c, etch stop layers 212a and 212b, phase change material layer 204a, and an electrode material layer 206a. Electrode material, such as TiN, TaN, W, TiSiN, TiAlN, TaSiN, TaAlN, or other suitable electrode material, is deposited over phase change material layer 204a to provide electrode material layer 206a. Electrode material layer 206a is deposited using CVD, ALD, MOCVD, PVD, JVP, or other suitable deposition technique.

Figure 32:
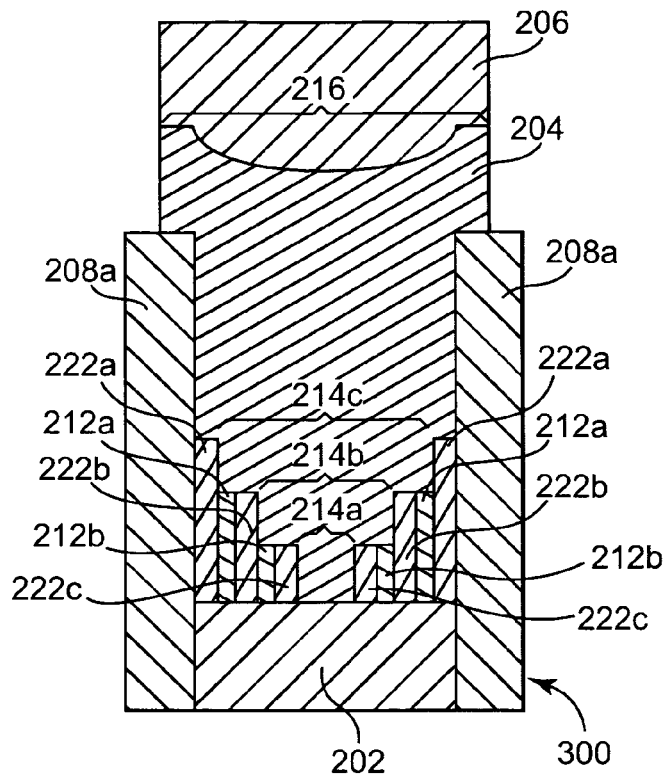
FIG. 32 illustrate a cross-sectional view of one embodiment of the memory cell portion, spacers, etch stop layers, phase change material, and a second electrode after etching the electrode material layer and the phase change material layer.

FIG. 32 illustrates a cross-sectional view of one embodiment of memory cell portion 300, spacers 222a-222c, etch stop layers 212a and 212b, phase change material 204, and second electrode 206 after etching electrode material layer 206a and phase change material layer 204a. Electrode material layer 206a and phase change material layer 204a are etched to expose a portion of insulation material layer 208a to provide second electrode 206 and phase change material 204. Phase change material 204 includes first phase change portion 214a, second phase change portion 214b, third phase change portion 214c, and additional extended two step phase change material portion 216.

Figure 33:
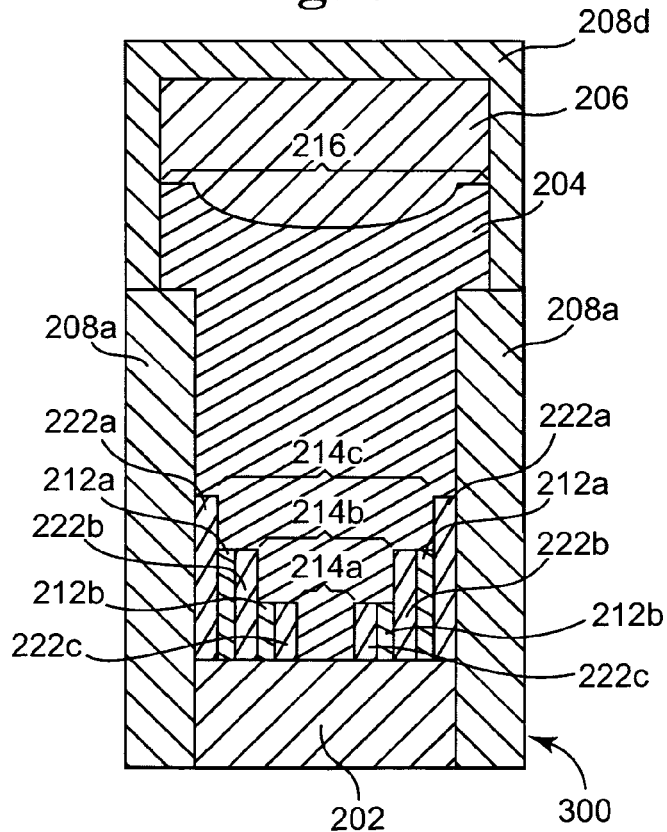
FIG. 33 illustrates a cross-sectional view of one embodiment of the memory cell portion, spacers, etch stop layers, phase change material, second electrode, and an insulation material layer.

FIG. 33 illustrates a cross-sectional view of one embodiment of memory cell portion 300, spacers 222a-222c, etch stop layers 212a and 212b, phase change material 204, second electrode 206, and an insulation material layer 208d. Insulation material, such as SiO$_2$, FSG, BPSG, BSG, low-k material, or other suitable dielectric material, is deposited over exposed portions of memory cell portion 300, second electrode 206, and phase change material 204 to provide insulation material layer 208d. Insulation material layer 208d is deposited using CVD, ALD, MOCVD, PVD, JVP, or other suitable deposition technique. Additional phase change material 216 contacts insulation material layer 208d.

Figure 34:
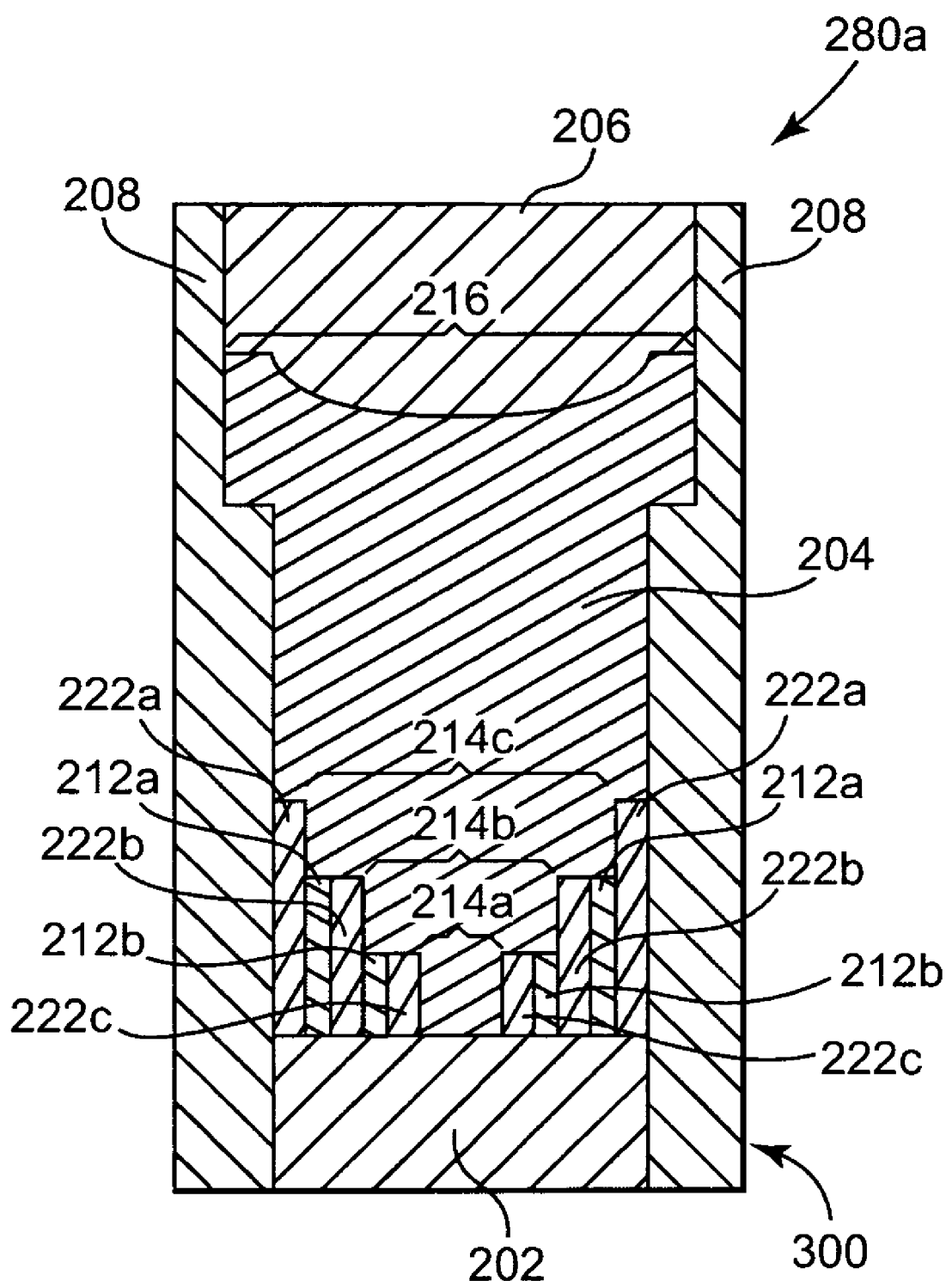
FIG. 34 illustrates a cross-sectional view of one embodiment of the memory cell portion, spacers, etch stop layers, phase change material, second electrode, and insulation material after planarizing the insulation material layer.

FIG. 34 illustrates a cross-sectional view of one embodiment of memory cell portion 300, spacers 222a-222c, etch stop layers 212a and 212b, phase change material 204, second electrode 206, and insulation material 208 after planarization. Insulation material layer 208d is planarized using CMP or another suitable planarization technique to expose second electrode 206 to provide insulation material 208 of phase change memory cell 280a as illustrated in FIG. 6A.

In another embodiment, memory cell portion 300 is replaced with alternate memory cell portion 310 in the process described and illustrated with reference to FIGS. 30-34 to provide phase change memory cell 280b as illustrated in FIG. 6B.

In another embodiment, spacers 222a-222c are replaced in the process described and illustrated with reference to FIGS. 30-34 with spacers 210a-210c.

In another embodiment, memory cell portion 300 is replaced with alternate memory cell portion 310 in the process described and illustrated with reference to FIGS. 30-34, and spacers 222a-222c are replaced in the process described and illustrated with reference to FIGS. 30-34 with spacers 210a-210c.

The following FIGS. 35-40 illustrate embodiments of a method for fabricating a phase change memory cell including phase change material forming a step-like pattern, such as phase change memory cell 240a previously described and illustrated with reference to FIG. 4A and phase change memory cell 240b previously described and illustrated with reference to FIG. 4B.

Figure 35:
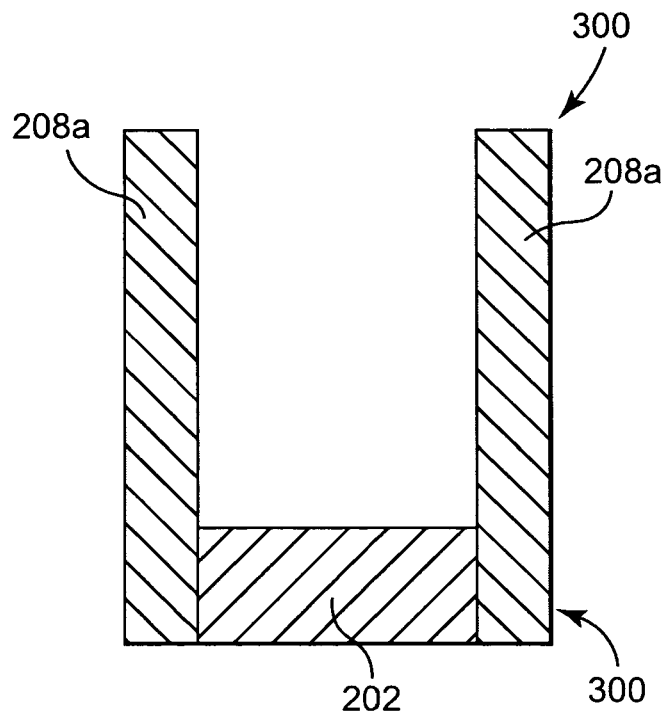
FIG. 35 illustrates a cross-sectional view of one embodiment of the memory cell portion as illustrated in FIG. 11.

FIG. 35 illustrates a cross-sectional view of one embodiment of memory cell portion 300 as previously described and illustrated with reference to FIG. 11.

Figure 36:
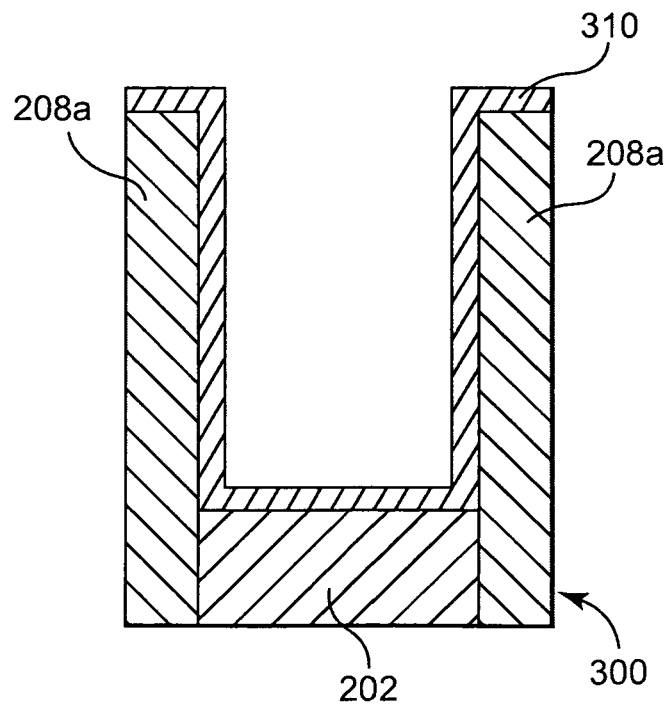
FIG. 36 illustrates a cross-sectional view of one embodiment of the memory cell portion and a first spacer material layer.

FIG. 36 illustrates a cross-sectional view of one embodiment of memory cell portion 300 and a first spacer material layer 310. Spacer material, such as SiO$_2$, FSG, BPSG, BSG, low-k material, or other suitable dielectric material, is conformally deposited over memory cell portion 300 to provide first spacer material layer 310. First spacer material layer 310 is deposited using CVD, ALD, MOCVD, PVD, JVP, or other suitable deposition technique.

Figure 37:
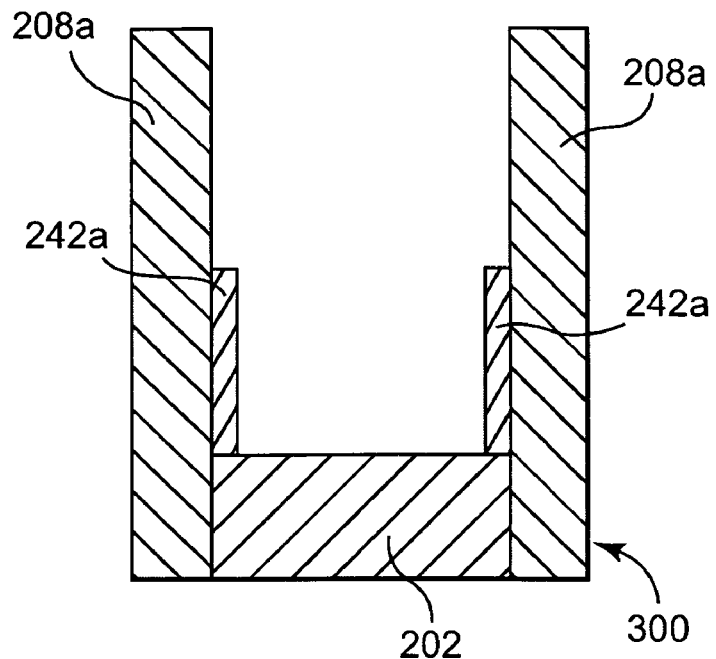
FIG. 37 illustrates a cross-sectional view of one embodiment of the memory cell portion and a first spacer or spacer pair after etching the first spacer material layer.

FIG. 37 illustrates a cross-sectional view of one embodiment of memory cell portion 300 and a first spacer or spacer pair 242a after etching first spacer material layer 310. First spacer material layer 310 is etched to expose a portion of the sidewalls of insulation material 208a and first electrode 202 to provide first spacer or spacer pair 242a.

Figure 38:
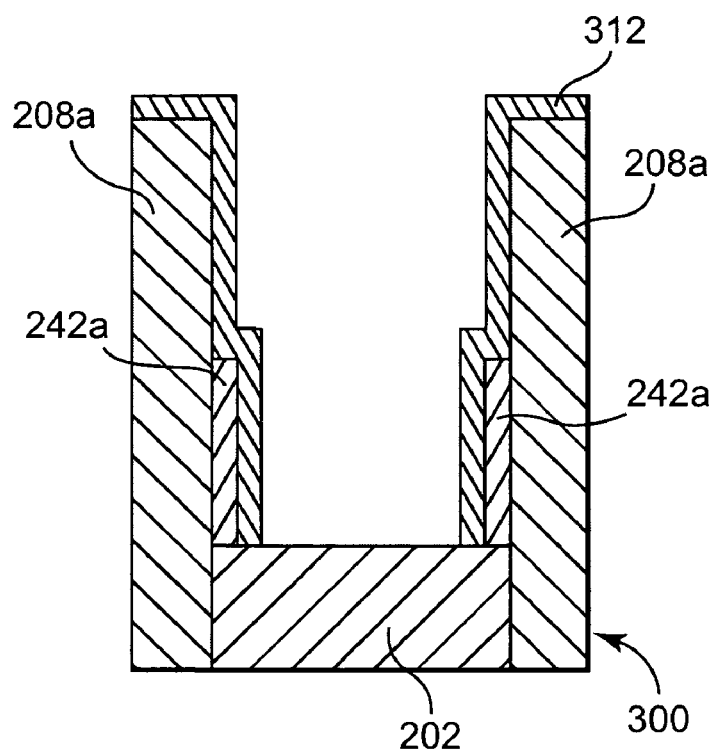
FIG. 38 illustrates a cross-sectional view of one embodiment of the memory cell portion, first spacer or spacer pair, and a second spacer material layer.

FIG. 38 illustrates a cross-sectional view of one embodiment of memory cell portion 300, first spacer pair 242a, and a second spacer material layer 312. Spacer material different than the material of first spacer or spacer pair 242a, such as SiO₂, FSG, BPSG, BSG, low-k material, or other suitable dielectric material, is conformally deposited over exposed portions of memory cell portion 300 and first spacer or spacer pair 242a to provide second spacer material layer 312. Second spacer material layer 312 is deposited using CVD, ALD, MOCVD, PVD, JVP, or other suitable deposition technique.

Figure 39:
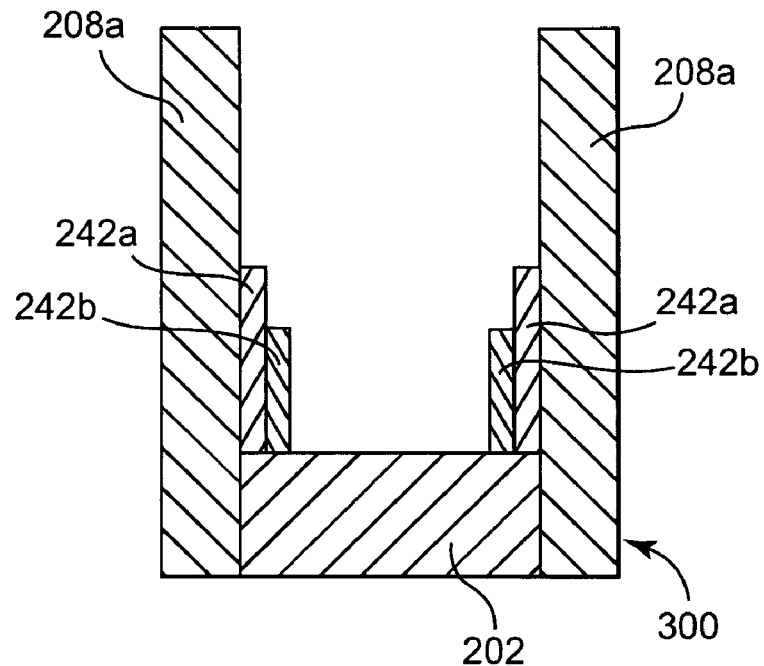
FIG. 39 illustrates a cross-sectional view of one embodiment of the memory cell portion, first spacer or spacer pair, and a second spacer or spacer pair after etching the second spacer material layer.

FIG. 39 illustrates a cross-sectional view of one embodiment of memory cell portion 300, first spacer or spacer pair 242a, and second spacer or spacer pair 242b after selectively etching second spacer material layer 312. Second spacer material layer 312 is selectively etched to expose a portion of the sides of first spacer or spacer pair 242a and first electrode 202 to provide second spacer or spacer pair 242b. By using a selective etch, further etching of first spacer or spacer pair 242a is prevented while etching second spacer material layer 312 to form second spacer or spacer pair 242b.

Figure 40:
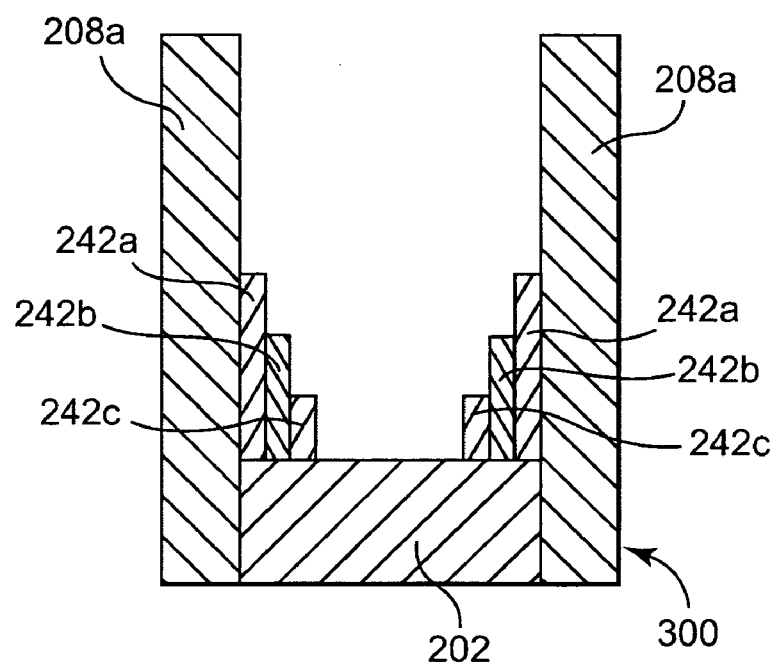
FIG. 40 illustrates a cross-sectional view of one embodiment of the memory cell portion, first spacer of spacer pair, second spacer or spacer pair, and a third spacer or spacer pair.

FIG. 40 illustrates a cross-sectional view of one embodiment of memory cell portion 300 and spacers 242a-242c. Spacers 242a-242c include first spacer or spacer pair 242a, second spacer or spacer pair 242b, and a third spacer or spacer pair 242c. The process of depositing a spacer material layer and etching the spacer material layer as illustrated in FIGS. 35-39 is repeated multiple times to provide spacers 242a-242c forming a step-like pattern. In one embodiment, the process of depositing a spacer material layer and etching the spacer material layer is repeated any suitable number of times to provide a desired number of spacers 242. In one embodiment, each of the spacers 242a-242c include different spacer materials. In other embodiments, at least two of the spacers 242a-242c include different spacer materials.

In one embodiment, the process of depositing a phase change material layer, etching the phase change material layer, depositing an electrode material layer, and planarizing the electrode material layer is performed as illustrated in FIGS. 20-23 to provide phase change memory cell 240a as illustrated in FIG. 4A. In another embodiment, the process of depositing a phase change material layer, planarizing the phase change material layer, depositing an electrode material layer, etching the electrode material layer, depositing an insulation material layer, and planarizing the insulation material layer is performed as illustrated in FIGS. 24-29 to provide phase change memory cell 240a as illustrated in FIG. 4A. In another embodiment, the process of depositing a phase change material layer, depositing an electrode material layer, etching the phase change material layer and the electrode material layer, depositing an insulation material layer, and planarizing the insulation material layer is performed as illustrated in FIGS. 30-34 to provide another embodiment of phase change memory cell 280a as illustrated in FIG. 6A.

In another embodiment, the process of depositing a phase change material layer, etching the phase change material layer, depositing an electrode material layer, and planarizing the electrode material layer is performed as illustrated in FIGS. 20-23, and memory cell portion 300 is replaced with alternate memory cell portion 310 to provide phase change memory cell 240b as illustrated in FIG. 4B. In another embodiment, the process of depositing a phase change material layer, planarizing the phase change material layer, depositing an electrode material layer, etching the electrode material layer, depositing an insulation material layer, and planarizing the insulation material layer is performed as illustrated in FIGS. 24-29, and memory cell portion 300 is replaced with alternate memory cell portion 310 to provide phase change memory cell 240b as illustrated in FIG. 4B. In another embodiment, the process of depositing a phase change material layer, depositing an electrode material layer, etching the phase change material layer and the electrode material layer, depositing an insulation material layer, and planarizing the insulation material layer is performed as illustrated in FIGS. 30-34, and memory cell portion 300 is replaced with alternate memory cell portion 310 to provide another embodiment of phase change memory cell 280b as illustrated in FIG. 6B.

The following FIGS. 41-44 illustrate embodiments of a method for fabricating phase change memory cell 260a previously described and illustrated with reference to FIG. 5A and phase change memory cell 260b previously described and illustrated with reference to FIG. 5B.

Figure 41:
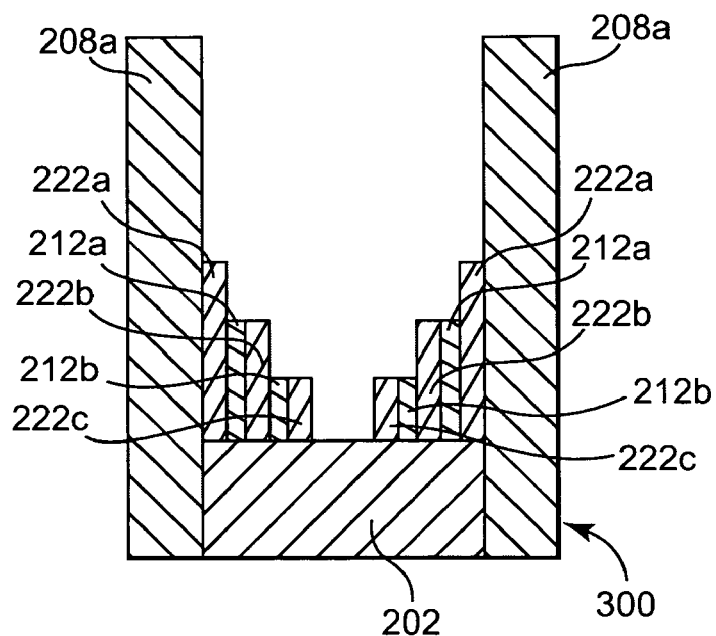
FIG. 41 illustrates a cross-sectional view of one embodiment of the memory cell portion, spacers, and etch stop layers as illustrated in FIG. 19.

FIG. 41 illustrates a cross-sectional view of one embodiment of memory cell portion 300, spacers 222a-222c, and etch stop layers 212a and 212b as illustrated in FIG. 19. Spacers 222a-222c include first spacer or spacer pair 222a, second spacer or spacer pair 222b, and third spacer or spacer pair 222c. Etch stop layers 212a and 212b include first etch stop layer or layer pair 212a and a second etch stop layer or layer pair 212b.

Figure 42:
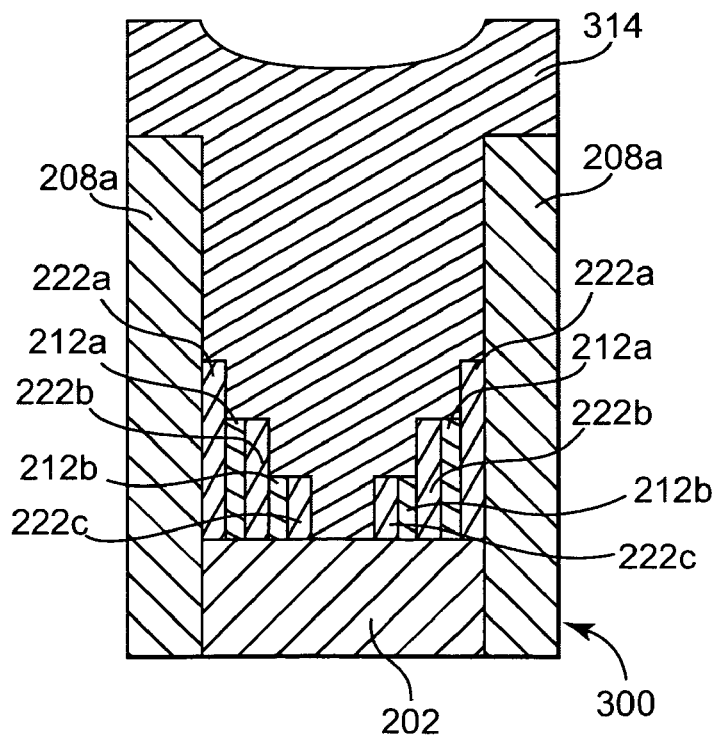
FIG. 42 illustrates a cross-sectional view of one embodiment of the memory cell portion, spacers, etch stop layers, and a first phase change material layer.

FIG. 42 illustrates a cross-sectional view of one embodiment of memory cell portion 300, spacers 222a-222c, etch stop layers 212a and 212b, and a first phase change material layer 314. Phase change material, such as a chalcogenide compound material or other suitable phase change material, is deposited over exposed portions of memory cell portion 300, spacers 222a-222c, and etch stop layers 212a and 212b to provide first phase change material layer 314. First phase change material layer 314 is deposited using CVD, ALD MOCVD, PVD, JVP, or other suitable deposition technique.

Figure 43:
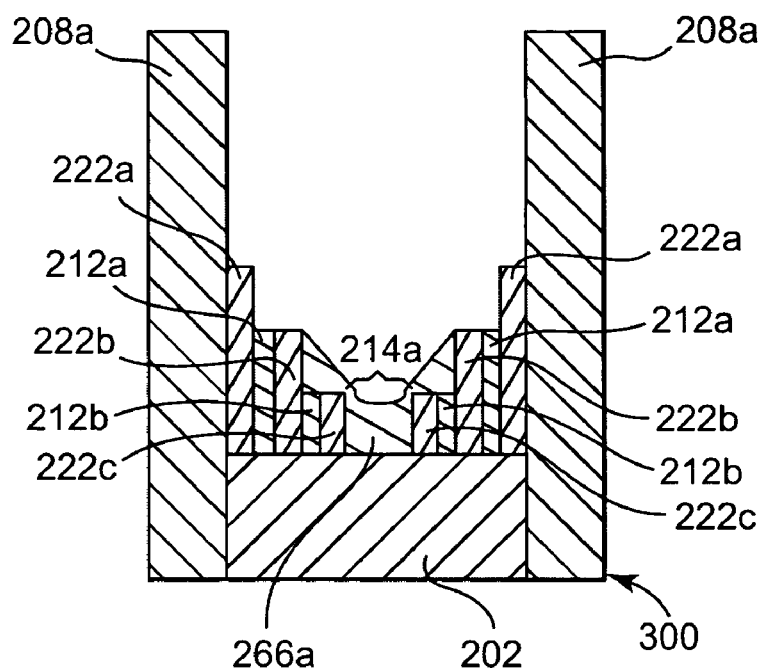
FIG. 43 illustrates a cross-sectional view of one embodiment of the memory cell portion, spacers, etch stop layers, and a first phase change portion after etching the first phase change material layer.

FIG. 43 illustrates a cross-sectional view of one embodiment of memory cell portion 300, spacers 222a-222c, etch stop layers 212a and 212b, and first phase change portion 214a after etching first phase change material layer 314. First phase change material layer 314 is etched to provide first phase change portion 214a. First phase change portion 214a contacts and is defined by third spacer or spacer pair 222c. First phase change portion 214a includes first phase change material 266a.

Figure 44:
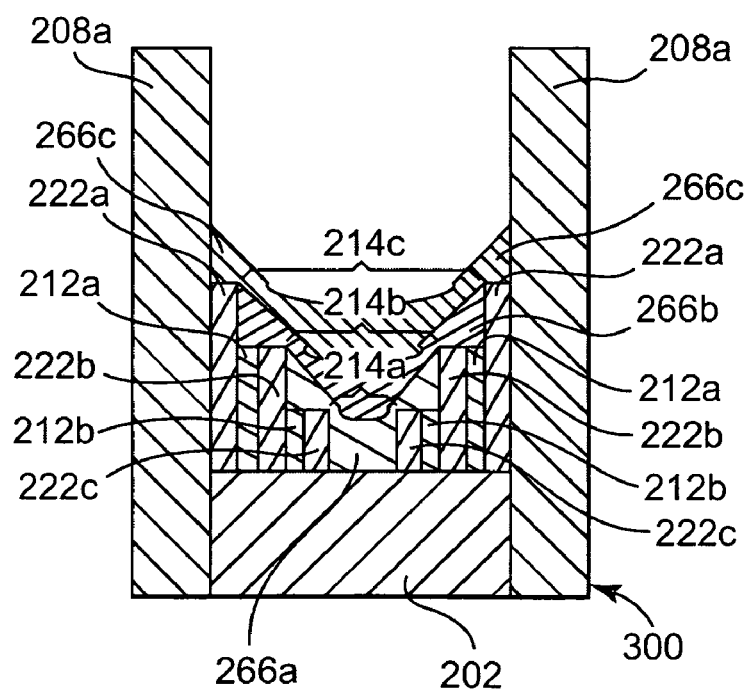
FIG. 44 illustrates a cross-sectional view of one embodiment of the memory cell portion, spacers, etch stop layers, first phase change portion, a second phase change portion, and a third phase change portion.

FIG. 44 illustrates a cross-sectional view of one embodiment of memory cell portion 300, spacers 222a-222c, etch stop layers 212a and 212b, and phase change portions 214a-214c. Phase change portions 214a-214c include a first phase change portion 214a, a second phase change portion 214b, and a third phase change portion 214c. First phase change portion 214a includes first phase change material 266a. Second phase change portion 214b includes second phase change material 266b. Third phase change portion 214c includes third phase change material 266c.

The process of depositing a phase change material layer and etching the phase change material layer as illustrated in FIGS. 42 and 43 is repeated multiple times to provide phase change portions 214a-214c. In one embodiment, the process of depositing a phase change material layer and etching the phase change material layer is repeated any suitable number of times to provide a desired number of phase change portions 214. In one embodiment, each of the phase change portions 214a-214c include different phase change materials. In another embodiment, at least two of the phase change portions 214a-214c include different phase change materials.

In one embodiment, the process of depositing a phase change material layer, etching the phase change material layer, depositing an electrode material layer, and planarizing the electrode material layer is performed as illustrated in FIGS. 20-23 to provide phase change memory cell 260a as illustrated in FIG. 5A. In another embodiment, the process of depositing a phase change material layer, planarizing the phase change material layer, depositing an electrode material layer, etching the electrode material layer, depositing an insulation material layer, and planarizing the insulation material layer is performed as illustrated in FIGS. 24-29 to provide phase change memory cell 260a as illustrated in FIG. 5A. In another embodiment, the process of depositing a phase change material layer, depositing an electrode material layer, etching the phase change material layer and the electrode material layer, depositing an insulation material layer, and planarizing the insulation material layer is performed as illustrated in FIGS. 30-34 to provide another embodiment of phase change memory cell 280a as illustrated in FIG. 6A.

In another embodiment, the process of depositing a phase change material layer, etching the phase change material layer, depositing an electrode material layer, and planarizing the electrode material layer is performed as illustrated in FIGS. 20-23, and memory cell portion 300 is replaced with alternate memory cell portion 310 to provide phase change memory cell 260b as illustrated in FIG. 5B. In another embodiment, the process of depositing a phase change material layer, planarizing the phase change material layer, depositing an electrode material layer, etching the electrode material layer, depositing an insulation material layer, and planarizing the insulation material layer is performed as illustrated in FIGS. 24-29, and memory cell portion 300 is replaced with alternate memory cell portion 310 to provide phase change memory cell 260b as illustrated in FIG. 5B. In another embodiment, the process of depositing a phase change material layer, depositing an electrode material layer, etching the phase change material layer and the electrode material layer, depositing an insulation material layer, and planarizing the insulation material layer is performed as illustrated in FIGS. 30-34, and memory cell portion 300 is replaced with alternate memory cell portion 310 to provide another embodiment of phase change memory cell 280b as illustrated in FIG. 6B.

Embodiments of the methods described and illustrated with reference to FIGS. 7-44 can be subdivided and/or combined to fabricate memory cells including phase change material forming step-like patterns as illustrated in FIGS. 2A, 2B, 6A, and 6B, memory cells including step-like patterns and varying thermal environments as illustrated in FIGS. 3A-4B, memory cells including step-like patterns using different phase change materials as illustrated in FIGS. 5A and 5B, or combinations thereof.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a memory comprising:
a first electrode;
a second electrode; and
contiguous resistivity changing material extending between the first electrode and the second electrode and directly contacting the first electrode and the second electrode, the resistivity changing material having a step-like programming characteristic, the contiguous resistivity changing material comprising a plurality of resistivity changing material portions each having a different cross-section,
wherein the first electrode, the second electrode, and the resistivity changing material form a via or trench memory cell, and
wherein the plurality of resistivity changing material portions are arranged in order from the resistivity changing material portion having the widest cross-section directly contacting the second electrode to the resistivity changing material portion having the narrowest cross-section directly contacting the first electrode.

2. The integrated circuit of claim 1, further comprising:
a plurality of spacers between the first electrode and the second electrode, the plurality of spacers defining a step-like pattern within the resistivity changing material.

3. The integrated circuit of claim 2, wherein the resistivity changing material comprises a plurality of rectangular layer or cylindrical layer portions, each of the plurality of rectangular layer or cylindrical layer portions defined by one or more of the plurality of spacers.

4. The integrated circuit of claim 2, further comprising:
an insulation material laterally surrounding the resistivity changing material, the plurality of spacers, the first electrode, and the second electrode, the insulation material and the plurality of spacers having the same thermal conductivity.

5. The integrated circuit of claim 2, further comprising:
an insulation material laterally surrounding the resistivity changing material, the plurality of spacers, the first electrode, and the second electrode, the plurality of spacers having a different thermal conductivity than the insulation material.

6. The integrated circuit of claim 5, wherein each of the spacers comprises a low-k material.

7. The integrated circuit of claim 2, further comprising:
a diffusion barrier between the plurality of spacers and the first electrode.

8. The integrated circuit of claim 7, wherein the diffusion barrier comprises a layer of resistivity changing material.

9. A memory cell comprising:
a first electrode;
a second electrode;
a plurality of contiguous phase change portions between the first electrode and the second electrode, each phase change material portion having a different cross-section; and
at least two contiguous spacers between the first electrode and the second electrode, the at least two contiguous spacers defining a step-like pattern within the plurality of contiguous phase change portions,
wherein the plurality of contiguous phase change material portions are arranged in order from the phase change material portion having the widest cross-section directly contacting the second electrode to the phase change material portion having the narrowest cross-section directly contacting the first electrode.

10. The memory cell of claim 9, wherein each of the phase change portions forms one of a rectangular shaped layer and a cylindrical shaped layer defined by one or more of the at least two spacers.

11. The memory cell of claim 9, further comprising:
an insulation material laterally surrounding the plurality of phase change material portions, the at least two spacers, the first electrode, and the second electrode, the insulation material and the at least two spacers having the same thermal conductivity.

12. The memory cell of claim 9, further comprising:
an insulation material laterally surrounding the plurality of phase change material portions, the at least two spacers, the first electrode, and the second electrode, the at least two spacers having a lower thermal conductivity than the insulation material.

13. The memory cell of claim 12, wherein each of the spacers comprises a low-k material.

14. The memory cell of claim 9, further comprising:
a diffusion barrier between the at least two spacers and the first electrode.

15. A memory cell comprising:
a first electrode;
a second electrode;
a plurality of contiguous phase change material layers between the first electrode and the second electrode, at least two of the plurality of contiguous phase change material layers comprising different phase change materials, each phase change material layer having a different cross-section; and
at least two contiguous spacers between the first electrode and the second electrode, the at least two contiguous spacers defining a step-like pattern within the plurality of phase change material layers,
wherein the plurality of contiguous phase change material layers are arranged in order from the phase change material layer having the widest cross-section directly contacting the second electrode to the phase change material layer having the narrowest cross-section directly contacting the first electrode.

16. The memory cell of claim 15, wherein at least two of the phase change material layers have different crystallization temperatures.

17. The memory cell of claim 15, wherein each phase change material layer provides a rectangular layer or cylindrical layer portion, each rectangular layer or cylindrical layer portion defined by one or more of the at least two spacers.

18. The memory cell of claim 15, further comprising:
an insulation material laterally surrounding the plurality of phase change material layers, the at least two spacers, the first electrode, and the second electrode.

19. The memory cell of claim 15, wherein at least one of the at least two spacers comprises a low-k material.

20. The memory cell of claim 15, further comprising:
a diffusion barrier between the at least two spacers and the first electrode.

21. An integrated circuit comprising:
a first electrode;
a second electrode; and
a plurality of contiguous phase change material portions extending between the first electrode and the second electrode, each phase change material portion having a different cross-section,
wherein the plurality of contiguous phase change material portions are arranged in order from the phase change material portion having the widest cross-section directly contacting the second electrode to the phase change material portion having the narrowest cross-section directly contacting the first electrode.

22. The integrated circuit of claim 21, wherein the phase change material portion having the narrowest cross-section is arranged between the phase change material portion having the widest cross-section and a wafer.

23. The integrated circuit of claim 21, further comprising:
a plurality of spacers between the first electrode and the second electrode, the plurality of spacers defining the cross-section of each phase change material portion.

24. The integrated circuit of claim 23, further comprising:
an insulation material laterally surrounding the plurality of contiguous phase change material portions, the plurality of spacers, the first electrode, and the second electrode, the insulation material and the plurality of spacers having the same thermal conductivity.

25. The integrated circuit of claim 23, further comprising:
an insulation material laterally surrounding the plurality of contiguous phase change material portions, the plurality of spacers, the first electrode, and the second electrode, the plurality of spacers having a different thermal conductivity than the insulation material.

26. The integrated circuit of claim 25, wherein each of the spacers comprises a low-k material.

27. The integrated circuit of claim 23, further comprising:
a diffusion barrier between the plurality of spacers and the first electrode.

28. The integrated circuit of claim 27, wherein the diffusion barrier comprises a layer of phase change material.

29. An integrated circuit comprising:
a first electrode;
a second electrode;
a plurality of contiguous phase change material portions extending between the first electrode and the second electrode, each phase change material portion having a different cross-section;
a plurality of spacers between the first electrode and the second electrode, the plurality of spacers defining the cross-section of each phase change material portion; and
a diffusion barrier between the plurality of spacers and the first electrode,
wherein the plurality of contiguous phase change material portions are arranged in order from the phase change material portion having the widest cross-section to the phase change material portion having the narrowest cross-section, and
wherein the diffusion barrier comprises a layer of phase change material contacting the first electrode and an electrode material layer contacting the spacers.

30. The integrated circuit of claim 21, wherein each phase change material portion comprises a rectangular layer of phase change material.

31. The integrated circuit of claim 21, wherein each phase change material portion comprises a cylindrical layer of phase change material.

32. An integrated circuit comprising:
a first electrode;
a second electrode;
a plurality of contiguous phase change material layers extending between the first electrode and the second electrode, at least two of the plurality of phase change material layers comprising different phase change materials; and
at least two contiguous spacers between the first electrode and the second electrode, the at least two contiguous spacers defining a plurality of portions of the plurality of contiguous phase change material layers, each portion having a different cross-section, wherein the portions are arranged in order from the portion having the widest cross-section directly contacting the second electrode to the portion having the narrowest cross-section directly contacting the first electrode.

33. The integrated circuit of claim 32, wherein the portion having the narrowest cross-section is arranged between the portion having the widest cross-section and a wafer.

34. The integrated circuit of claim 32, wherein at least two of the phase change material layers have different crystallization temperatures.

35. The integrated circuit of claim 32, wherein each portion comprises a rectangular layer.

36. The integrated circuit of claim 32, wherein each portion comprises a cylindrical layer.

37. The integrated circuit of claim 32, further comprising:
an insulation material laterally surrounding the plurality of phase change material layers, the at least two spacers, the first electrode, and the second electrode.

38. The integrated circuit of claim 32, wherein at least one of the at least two spacers comprises a low-k material.

39. The integrated circuit of claim 32, further comprising:
a diffusion barrier between the at least two spacers and the first electrode.

40. The integrated circuit of claim 39, wherein the diffusion barrier comprises a layer of phase change material.

* * * * *